United States Patent
Yamakawa et al.

(10) Patent No.: US 12,291,587 B2
(45) Date of Patent: May 6, 2025

(54) PHOTOCROSSLINKABLE POLYMER, INSULATING FILM, PLANARIZATION FILM, LYOPHILIC/LIQUID REPELLENT PATTERNED FILM, AND ORGANIC FIELD EFFECT TRANSISTOR DEVICE COMPRISING SAME

(71) Applicant: TOSOH CORPORATION, Shunan (JP)

(72) Inventors: Hiroshi Yamakawa, Yokkaichi (JP); Shinya Oku, Yokkaichi (JP); Shohei Yumino, Yokkaichi (JP); Junghwi Lee, Yokkaichi (JP); Fumiaki Katagiri, Yokkaichi (JP)

(73) Assignee: TOSOH CORPORATION, Shunan (JP)

( * ) Notice: Subject to any disclaimer, the term of this patent is extended or adjusted under 35 U.S.C. 154(b) by 1621 days.

(21) Appl. No.: 16/494,107

(22) PCT Filed: Mar. 9, 2018

(86) PCT No.: PCT/JP2018/009167
§ 371 (c)(1),
(2) Date: Sep. 13, 2019

(87) PCT Pub. No.: WO2018/168676
PCT Pub. Date: Sep. 20, 2018

(65) Prior Publication Data
US 2021/0135115 A1    May 6, 2021

(30) Foreign Application Priority Data

Mar. 16, 2017 (JP) .................... 2017-051670
Oct. 13, 2017 (JP) .................... 2017-199489
(Continued)

(51) Int. Cl.
*C08F 212/14* (2006.01)
*C08F 112/08* (2006.01)
(Continued)

(52) U.S. Cl.
CPC .......... *C08F 212/22* (2020.02); *C08F 112/08* (2013.01); *C08F 212/02* (2013.01);
(Continued)

(58) Field of Classification Search
None
See application file for complete search history.

(56) References Cited

U.S. PATENT DOCUMENTS 2,566,302 A    9/1951    Allen et al.
2,708,665 A    5/1955    Unruh
(Continued)

FOREIGN PATENT DOCUMENTS

CN    106030395 A    10/2016
EP    0883016 A1 * 12/1998    ............ G02F 1/1335
(Continued)

OTHER PUBLICATIONS

International Search Report issued Jun. 12, 2018 in PCT/JP2018/009167 filed Mar. 9, 2018.
(Continued)

*Primary Examiner* — John Vincent Lawler
(74) *Attorney, Agent, or Firm* — Oblon, McClelland, Maier & Neustadt, L.L.P.

(57) ABSTRACT

Provided is a resin which is excellent in terms of solubility in common solvents, crosslinking temperature, time required for crosslinking, solvent resistance (cracking resistance), breakdown voltage, leakage current, solvent wettability, and planarity in cases where the resin is formed into a thin film. A resin which comprises repeating units repre-
(Continued)

sented by formula (1) and formula (2), and wherein the repeating unit represented by formula (2) is contained in an amount of 20% by mole or more relative to the total amount of the repeating units represented by formula (1) and formula (2).

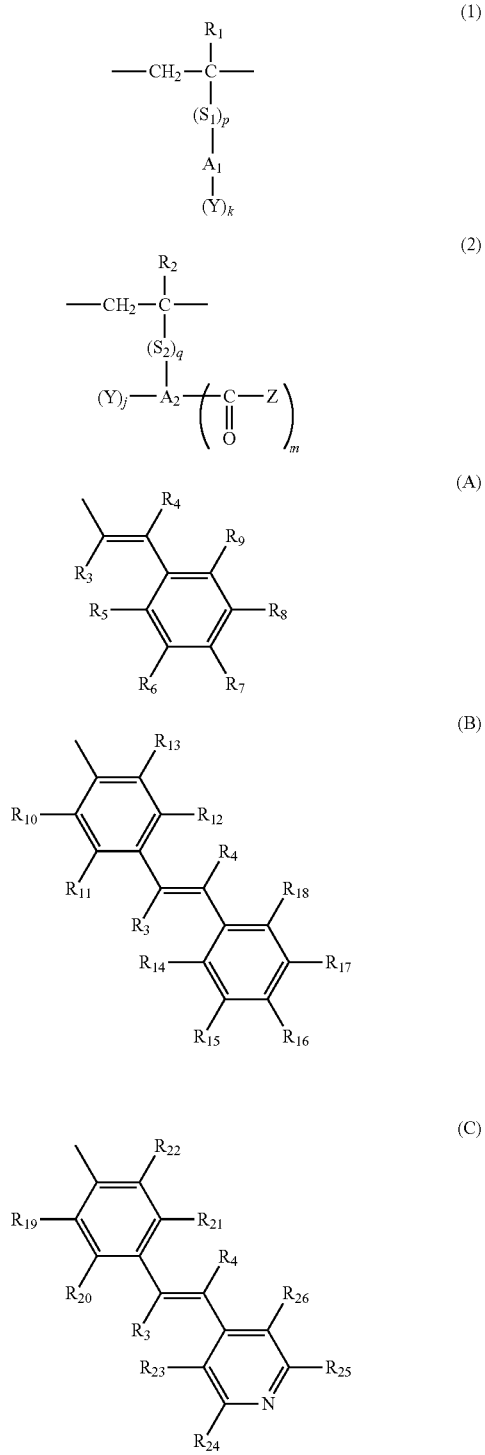

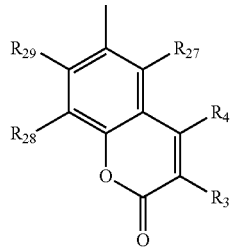

15 Claims, 3 Drawing Sheets

(30) Foreign Application Priority Data

Jan. 26, 2018 (JP) .................................. 2018-011579
Jan. 26, 2018 (JP) .................................. 2018-011580

(51) Int. Cl.
  *C08F 212/02* (2006.01)
  *C08F 297/00* (2006.01)
  *C08J 5/18* (2006.01)
  *H10K 10/46* (2023.01)
  *H10K 85/10* (2023.01)
  *H10K 85/60* (2023.01)

(52) U.S. Cl.
  CPC .......... *C08F 212/26* (2020.02); *C08F 297/00* (2013.01); *C08J 5/18* (2013.01); *H10K 85/111* (2023.02); *H10K 85/151* (2023.02); *H10K 85/6576* (2023.02); *C08F 2810/20* (2013.01); *C08F 2810/50* (2013.01); *C08J 2325/06* (2013.01); *C08J 2353/00* (2013.01); *H10K 10/471* (2023.02)

(56) References Cited

U.S. PATENT DOCUMENTS

| | | | |
|---|---|---|---|
| 2008/0161524 A1 | 7/2008 | Yan et al. | |
| 2011/0215334 A1 | 9/2011 | Quinn et al. | |
| 2016/0355735 A1* | 12/2016 | Motooka | C08F 12/26 |
| 2017/0054076 A1* | 2/2017 | Nagata | C08F 220/283 |

FOREIGN PATENT DOCUMENTS

| | | |
|---|---|---|
| JP | 11-52134 A | 2/1999 |
| JP | 5148624 B2 | 2/2013 |
| JP | 5960202 B2 | 8/2016 |
| JP | 2018-18928 A | 2/2018 |
| JP | 2018-70805 A | 5/2018 |

OTHER PUBLICATIONS

Jang, J. et al., "Hysteresis-free organic field-effect transistors and inverters using photocrosslinkable poly(vinyl cinnamate) as a gate dielectric," Applied Physics Letters, vol. 92, 2008, pp. 143306-1-143306-3, 4 total pages.
Jang, J. et al., "Photopatternable ultrathin gate dielectrics for low-voltage-operating organic circuits," Applied Physics Letters, vol. 95, 2009, pp. 0733302-1-0733302-3, 4 total pages.

\* cited by examiner

PHOTOCROSSLINKABLE POLYMER, INSULATING FILM, PLANARIZATION FILM, LYOPHILIC/LIQUID REPELLENT PATTERNED FILM, AND ORGANIC FIELD EFFECT TRANSISTOR DEVICE COMPRISING SAME

TECHNICAL FIELD

The present invention relates to a resin which forms a film excellent in planarity when being applied in a solution state, is easily crosslinked by short-time irradiation with light, has excellent wettability (overcoating property) with respect to a solvent while having solvent resistance (cracking resistance), and has high breakdown voltage.

BACKGROUND ART

Resins for forming a polymer dielectric layer (an insulating film layer) to be used for an organic field effect transistor device are required to have high breakdown voltage, low leakage current, solubility in commonly-used organic solvents, crosslinkability for expressing solvent resistance (cracking resistance). Furthermore, polymer dielectric layers after crosslinking are required to have excellent wettability with respect to organic solvents and high planarity.

The breakdown voltage refers to a maximum electric field value that can be applied without destroying a dielectric layer constituting the device. As the breakdown voltage is higher, the stability of the device is enhanced. The leakage current is an indicator representing a size of the current or the like flowing through a path other than the original conductive path, for example, flowing from a gate electrode to a source electrode through the inside of the insulating dielectric layer. The leakage current is determined by preparing an MIM capacitor having a three-layer structure consisting of metal/dielectric substance/metal, and measuring a value of an electric current flowing in the dielectric layer.

The solubility in commonly-used solvents is an essential requirement for producing an organic field effect transistor device by a printing method. Meanwhile, in the organic field effect transistor device, a polymer dielectric layer is stacked on an overlay layer such as an organic semiconductor layer. Therefore, when the overlay layer is formed on the polymer dielectric layer by a printing method using a solvent, it is necessary that a polymer dielectric substance is not dissolved in the solvent (the solvent to be used for the printing method). Accordingly, the polymer dielectric layer (insulating film layer) is required to have opposing performance, that is, having solubility in commonly-used organic solvent during formation of a layer, and having insolubility with respect to the organic solvent after formation of the layer.

As a technology corresponding to such requirements, a technology of crosslinking a polymer dielectric layer formed in solution is known. For example, a benzocyclobutene resin and a polyvinylphenol resin are known. However, the crosslinking of benzocyclobutene resin requires a high crosslinking temperature of 250° C. When a substrate is plastic, it is difficult to use the benzocyclobutene resin because the substrate is thermally deformed. Further, the benzocyclobutene resin requires a long curing time, and is less economical. In addition, it has been very difficult to apply the benzocyclobutene resin to a roll-to-roll process, and film planarity which influences on device performance has not been sufficient. Polyvinylphenol needs long-time hardening reaction using a melamine resin or the like as a crosslinking agent at a temperature of around 150° C., and it is very difficult to apply polyvinylphenol to a roll-to-roll process. Furthermore, a hydroxyl group of the polyvinylphenol resin is not completely eliminated, and high leakage current is problem which is estimated to be caused by hydrophilic property of the remaining hydroxyl groups. In addition, the planarity of the film has not been sufficient.

Furthermore, as a resin of a type that does not need crosslinking, which is to be used in a polymer dielectric layer (insulating film layer), use of a fluorine cyclic ether resin, polyparaxylylene resin, or the like, has been proposed. Since the fluorine cyclic ether resin is not dissolved in a commonly-used organic solvent after the resin is formed into a film, it has an advantage of being insoluble in commonly-used solvents even in a state in which it is not crosslinked, but is less economical. In addition, since this material has low surface tension, it has low wettability with respect to a substrate, so that there has been restriction to substrate that can undergo application or printing. Furthermore, there has been a problem that because of low wettability, pin-holes are easily formed, thus increasing the leakage current. The polyparaxylylene resin has an advantage of not being dissolved in commonly-used solvents because the polyparaxylylene resin is formed into a film by depositing a monomer on the substrate by a vacuum evaporation method and then polymerizing the monomer on the substrate. However, the polyparaxylylene resin has a fatal flaw that it cannot correspond to the printing process and the roll-to-roll process.

Photocrosslinking technology is known as means of being capable of crosslinking at a low temperature and shortening crosslinking time. For example, there is a disclosed technology using a photocrosslinkable polymer as a polymer dielectric substance. The photocrosslinkable polymer is obtained by reacting a photocrosslinkable compound such as a cinnamoyl group to polymers having a hydroxyl group in a side chain, such as poly(hydroxyethyl methacrylate), vinyl phenol/methyl methacrylate copolymer, poly(acetoxyethyl methacrylate), and poly(hydroxyethyl methacrylate) (see, for example, Patent Document 1). Furthermore, a photocrosslinkable polymer in which coumarin has been introduced as a photocrosslinking group in a vinyl polymer having a phenol group at a side chain has been proposed (see, for example, Patent Document 2). However, in the technologies disclosed in Patent Documents 1 and 2, it is difficult to react all the hydroxyl groups present in a hydroxyl group-containing polymer with photocrosslinkable compound, and remaining of a hydroxyl group cannot be avoided. As a result, use of these polymers as an insulating film causes an increase of a leakage current value and/or hysteresis. Furthermore, Patent Document 1 discloses also a technology of decreasing a remaining amount of hydroxyl group by reacting an unreacted hydroxyl group and trifluoroacetic anhydride for esterification. However, there is disadvantages that it is very difficult to completely eliminate hydroxyl groups, and introduction of a fluorine compound may deteriorate the wettability with respect to an organic solvent.

Furthermore, a technology using poly(vinyl cinnamate) as a polymer dielectric layer of the organic field effect transistor device is proposed (see, for example, Non-Patent Documents 1 and 2), the surface roughness of the polymer dielectric layer (insulating film layer) coated with a solution is about 0.7 nm and therefore further planarization has been demanded.

In addition to these technologies, a technology relating to a photosensitive resin is known. For example, a technology relating to a photosensitive resin in which a compound having a photoreactive group is introduced into an aromatic vinyl polymer such as polystyrene and poly-α-methylstyrene by Friedel-Crafts acylation reaction was disclosed in 1950s. However, this technology has a problem that when a large number of photoreactive groups are attempted to be introduced in order to shorten the photosensitive time, the resin is gels during a production process. Therefore, the amount of the photoreactive groups is required to be less than 17% by mole relative to the total amount of monomers constituting the polymer (see, for example, Non-Patent Documents 3 and 4). Therefore, when the photosensitive resin that reacts (crosslinks) by photo-irradiation is used as the aforementioned polymer dielectric layer, since the concentration of the photoreactive group is small, the crosslinking density of the photocrosslinked film is lowered. As a result, when the organic solvent solution of an organic semiconductor, a polymer solution, or the like, is printed on the film, the crosslinked film absorbs the solvent and swells. When this film is dried, the film contracts again, and cracks occur on the film in the contraction process. In addition, there is a problem that since the concentration of the photoreactive group is low, the crosslinking time is long, thus reducing productivity.

As mentioned above, conventionally known resins used for polymer dielectric layers (insulating film layers) have some problems in terms of solubility in commonly-used solvents, crosslinking temperature, time required for crosslinking, solvent resistance (cracking resistance), solvent wettability, leakage current, breakdown voltage, and planarity in a case where the resin is formed into a film. A resin which can solve all these problems, and a polymer dielectric layer (insulating film layer) including the resin, have been demanded.

Patent Document 1: Japanese Patent No. 5148624
Patent Document 2: Japanese Patent No. 5960202
Patent Document 3: U.S. Pat. No. 2,566,302
Patent Document 4: U.S. Pat. No. 2,708,665
Non-Patent Document 1: Applied Physics Letters, vol. 92, p. 143306 (2008)
Non-Patent Document 2: Applied Physics Letters, vol. 95, p. 073302 (2009)

DISCLOSURE OF THE INVENTION

Problems to be Solved by the Invention

The present invention has been made in view of the above problems, and has an object to provide a resin capable of producing a polymer dielectric layer (insulating film layer) having excellent performance in terms of solubility in commonly-used solvents, crosslinking temperature, time required for crosslinking, solvent resistance (cracking resistance), solvent wettability, leakage current, and breakdown voltage.

Means for Solving the Problems

The present inventors have extensively studied for solving the above problems. As a result, the present inventors have found that a certain resin is excellent in all of solubility in commonly-used solvents, crosslinking temperature, time required for crosslinking, solvent resistance (cracking resistance), solvent wettability, leakage current, and breakdown voltage, which the insulating film requires, and have reached the completion of the present invention.

In other words, the present invention is in the following [1] to [5].

[1] A resin comprising repeating units represented by the formulae (1) and (2), wherein the resin includes 20% by mole or more of repeating units represented by the formula (2) with respect to a total amount of the repeating units represented by the formulae (1) and (2).

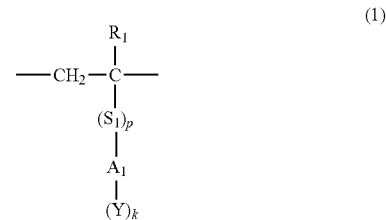

(In the formula (1), $R_1$ represents hydrogen or a C1-C6 alkyl group; $S_1$ represents —O— or —C(O)—; p represents 0 or 1; $A_1$ represents a C6-C19 aryl group; Y represents halogen, a cyano group, a carboxyalkyl group, an alkyl ether group, an aryl ether group, a C1-C18 alkyl group, a fluoroalkyl group, or a cycloalkyl group. Further, k represents an integer from 0 to (s-1). Herein, s represents the number of carbon atoms constituting the $A_1$.)

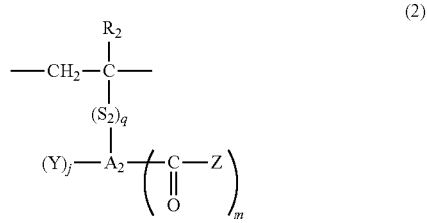

{(In formula (2), $R_2$ represents hydrogen or a $C_1$-C6 alkyl group; $S_2$ represents —O— or —C(O)—; q represents 0 or 1; $A_2$ represents a C6-C19 aryl group; Y represents a substituent as defined in formula (1); j represents an integer from 0 to (r-2) and m represents an integer from 1 to (r-j-1). Herein, r represents the number of carbon atoms constituting the $A_2$. Further, Z represents at least one organic group selected from the formulae (A) to (D).)

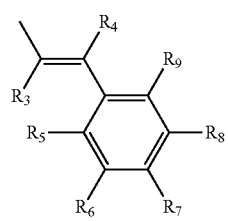

-continued

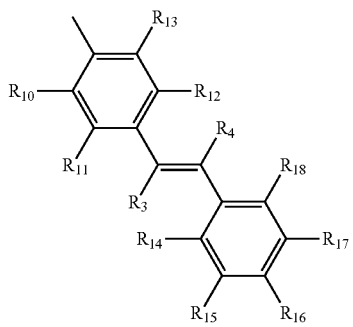

(B)

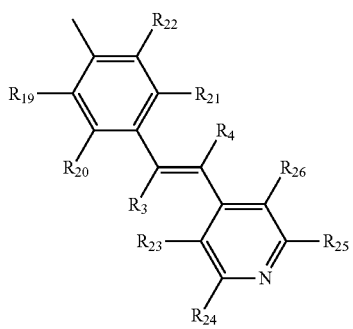

(C)

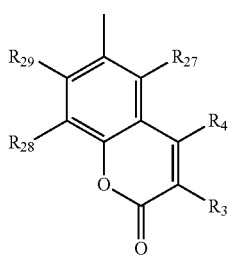

(D)

(In the formulae (A) to (D), $R_3$ and $R_4$ each independently represents hydrogen, a C1-C6 alkyl group, an aryl group, or a carboxyalkyl group; and $R_5$ to $R_{29}$ independently represent hydrogen, halogen, a cyano group, a carboxyalkyl group, an alkyl ether group, an aryl ether group, a C1-C18 alkyl group, a fluoroalkyl group, or a cycloalkyl group.)}

[2] An insulating film including a crosslinked product of the resin according to the above [1].

[3] An organic field effect transistor device in which, on a substrate, an organic semiconductor layer on which a source electrode and a drain electrode are attached and a gate electrode are stacked to each other via a gate insulating layer, wherein the gate insulating layer is the insulating film according to the above [2].

[4] A planarization film including the resin according to the above [1] and/or a crosslinked product of the resin according to the above [1].

[5] A lyophilic/liquid-repellent patterned film including the resin according to the above [1] and/or a crosslinked product of the resin according to the above [1].

Hereinafter, the present invention will be described in detail.

The resin of the present invention includes repeating units represented by the above formulae (1) and (2).

In the formula (1), $R_1$ represents hydrogen or a C1-C6 alkyl group.

The C1-C6 alkyl group represented by $R_1$ in the formula (1) is not particularly limited, and examples thereof include a methyl group, an ethyl group, a n-propyl group, an isopropyl group, a n-butyl group, and the like.

In the formula (1), $S_1$ represents —O— or —C(O)—.

In the formula (1), p represents 0 or 1.

In the formula (1), $A_1$ represents a C6-C19 aryl group.

The C6-C19 aryl group represented by $A_1$ in the formula (1) is not particularly limited, and examples thereof include a phenyl group, a naphthyl group, an anthryl group, a biphenyl group, and the like.

In the formula (1), Y represents halogen, a cyano group, a carboxyalkyl group, an alkyl ether group, an aryl ether group, a C1-C18 alkyl group, a fluoroalkyl group, or a cycloalkyl group.

The halogen represented by Y in the formula (1) is not particularly limited, and examples thereof include chlorine, fluorine, and the like.

The carboxyalkyl group represented by Y in the formula (1) is not particularly limited, and examples thereof include a carboxymethyl group, a carboxyethyl group, a carboxypropyl group, and the like.

The alkyl ether group represented by Y in the formula (1) is not particularly limited, and examples thereof include a methoxy group, an ethoxy group, a n-propoxy group, an isopropoxy group, a butoxy, and the like.

The aryl ether group represented by Y in the formula (1) is not particularly limited, and examples thereof include a phenoxy group, a 4-methylphenoxy group, a 4-tert-butylphenoxy group, a 1-naphthoxy group, a 2-naphthoxy group, and the like.

The C1-C18 alkyl group represented by Y in the formula (1) is not particularly limited, and examples thereof include a methyl group, an ethyl group, a n-propyl group, an isopropyl group, a n-butyl group, and the like.

The fluoroalkyl group represented by Y in the formula (1) is not particularly limited, and examples thereof include a 1,1,1-trifluoroethyl group, a 1,1,1,2,2-pentafluoropropyl group, a 1,1,1,2,2,3,3-heptafluorobutyl group, and the like.

The cycloalkyl group represented by Y in the formula (1) is not particularly limited, and examples thereof include a cyclobutyl group, a cyclopentyl group, a cyclohexyl group, and the like. In the formula (1), k represents an integer from 0 to (s-1). Herein, s represents the number of carbon atoms constituting the $A_1$.

In the formula (2), $R_2$ represents hydrogen or a C1-C6 alkyl group.

The C1-C6 alkyl group represented by $R_2$ in the formula (2) is not particularly limited, and examples thereof include a methyl group, an ethyl group, a n-propyl group, an isopropyl group, a n-butyl group, and the like.

In the formula (2), $S_2$ represents —O— or —C(O)—.

In the formula (2), q is 0 or 1.

In the formula (2), $A_2$ represents a C6-C19 aryl group.

The C6-C19 aryl group represented by $A_2$ in the formula (2) is not particularly limited, and examples thereof include a phenyl group, a naphthyl group, an anthryl group, a biphenyl group, and the like.

In the formula (2), Y represents substituents same as those defined in the formula (1).

In the formula (2), m represents an integer from 1 to (r-j-1).

Herein, r represents the number of carbon atoms constituting the $A_2$, and j represents an integer from 0 to (r-2).

In the formula (2), Z represents at least one organic group selected from the formulae (A) to (D).

In the formulae (A) to (D), $R_3$ and $R_4$ each independently hydrogen, a C1-C6 alkyl group, an aryl group, or a carboxyalkyl group; $R_5$ to $R_{29}$ each independently hydrogen, halogen, a cyano group, a carboxyalkyl group, an alkyl ether group, an aryl ether group, a C1-C18 alkyl group, a fluoroalkyl group, or a cycloalkyl group.

The C1-C6 alkyl group represented by $R_3$ and $R_4$ in the formulae (A) to (D) is not particularly limited, and examples thereof include a methyl group, an ethyl group, a n-propyl group, an isopropyl group, a n-butyl group, and the like.

The aryl group represented by $R_3$ and $R_4$ in the formulae (A) to (D) is not particularly limited, and examples thereof include a phenyl group, a naphthyl group, an anthryl group, a biphenyl group, and the like.

The carboxyalkyl group represented by $R_3$ and $R_4$ in the formulae (A) to (D) is not particularly limited, and examples thereof include a carboxymethyl group, a carboxyethyl group, a carboxypropyl group, and the like.

The halogen represented by $R_5$ to $R_{29}$ in the formulae (A) to (D) is not particularly limited, and examples thereof include chlorine, fluorine, and the like.

The carboxyalkyl group represented by $R_5$ to $R_{29}$ in the formulae (A) to (D) is not particularly limited, and examples thereof include carboxymethyl group, carboxyethyl group, carboxypropyl group, and the like.

The alkyl ether group represented by $R_5$ to $R_{29}$ in the formulae (A) to (D) is not particularly limited, and examples thereof include a methoxy group, an ethoxy group, a n-propoxy group, an isopropoxy group, a butoxy, and the like.

The aryl ether group represented by $R_5$ to $R_{29}$ in the formulae (A) to (D) is not particularly limited, and examples thereof include a phenoxy group, a p-methylphenoxy group, a p-ethylphenoxy group, a p-methoxyphenoxy group, and the like.

The C1-C18 alkyl group represented by $R_5$ to $R_{29}$ in the formulae (A) to (D) is not particularly limited, and examples thereof include a methyl group, an ethyl group, a n-propyl group, an isopropyl group, a n-butyl group, a n-hexyl group, a n-decyl group, a n-octadecyl group, and the like.

The fluoroalkyl group represented by $R_5$ to $R_{29}$ in the formulae (A) to (D) is not particularly limited, and examples thereof include a 1,1,1-trifluoroethyl group, a 1,1,1,2,2-pentafluoropropyl group, a 1,1,1,2,2,3,3-heptafluorobutyl group, and the like.

The cycloalkyl group represented by $R_5$ to $R_{29}$ in the formulae (A) to (D) is not particularly limited, and examples thereof include a cyclobutyl group, a cyclopentyl group, a cyclohexyl group, and the like.

Specific examples of the organic groups represented by the formula (A) can include the followings.

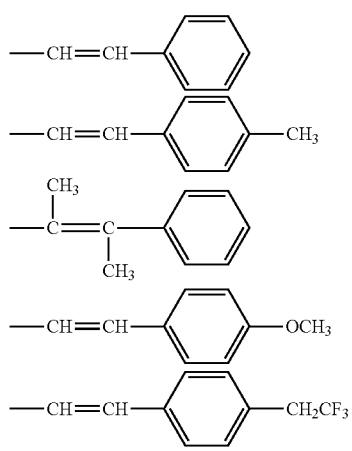

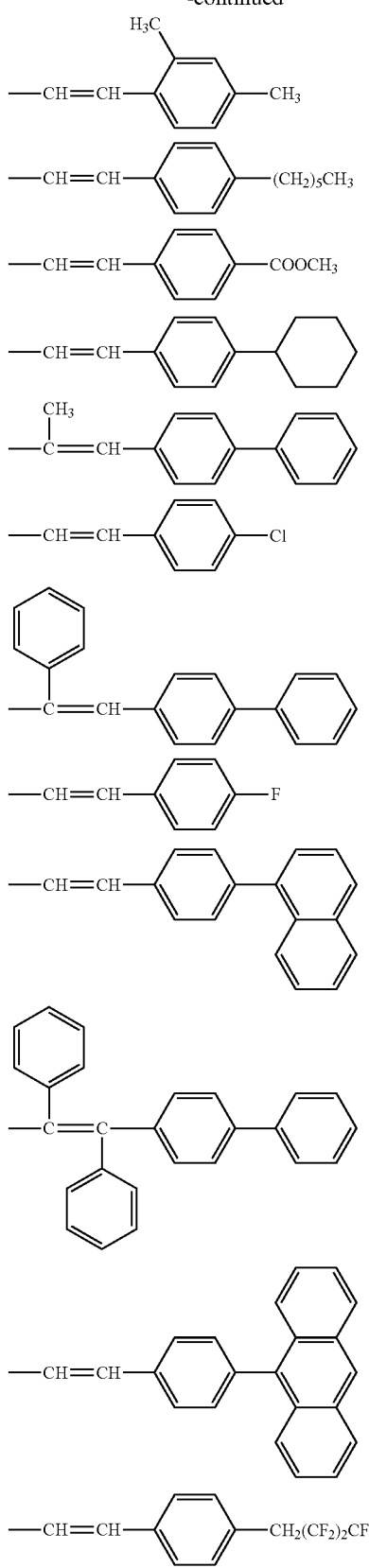

Specific examples of the organic groups represented by the formula (B) can include the followings.

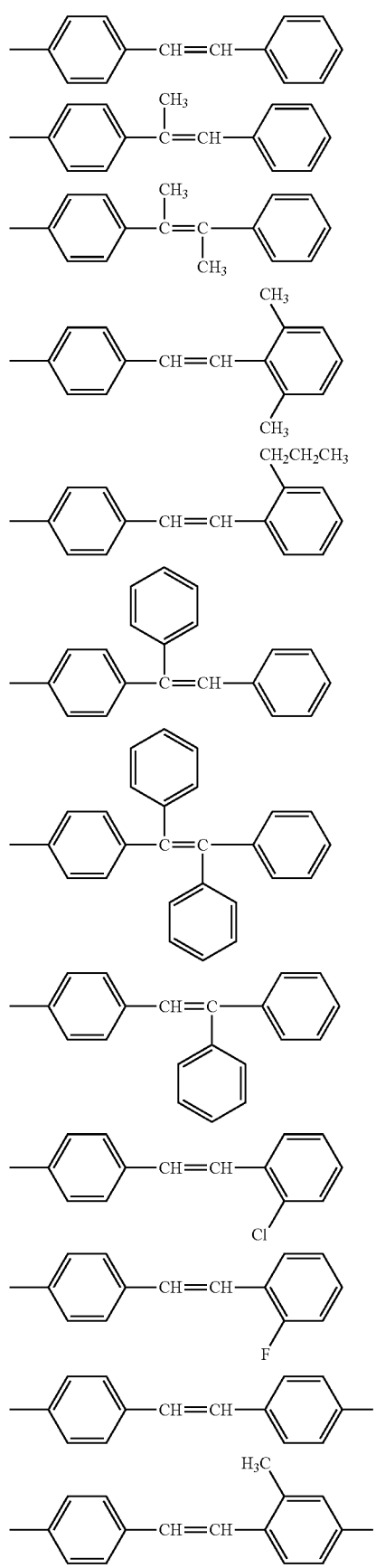
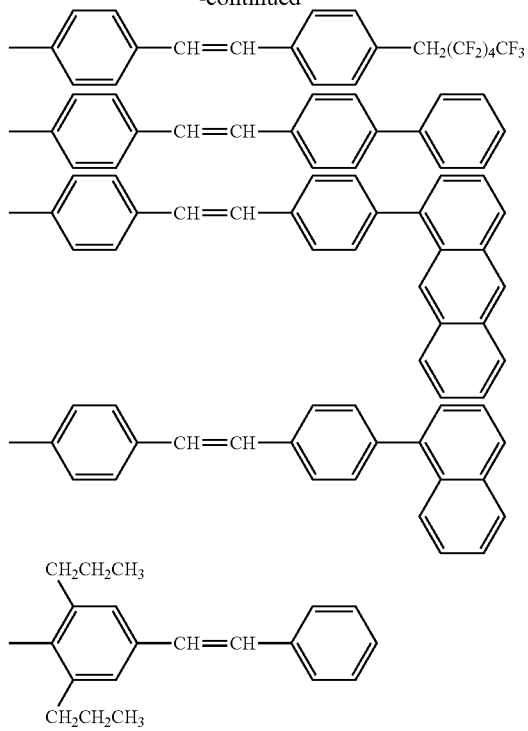
Specific examples of the organic groups represented by the formula (C) can include the followings.
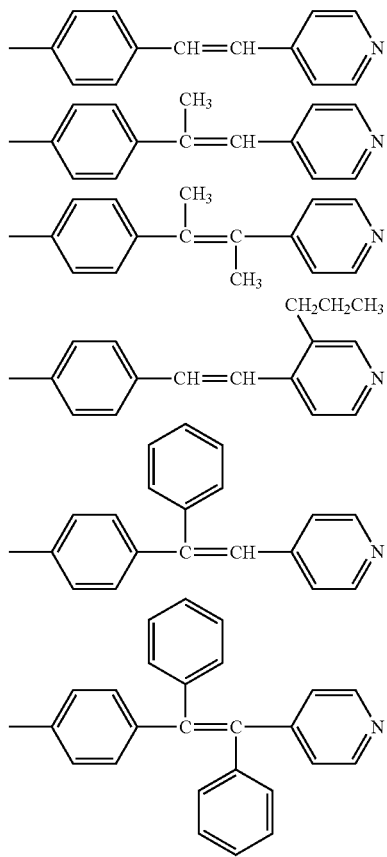

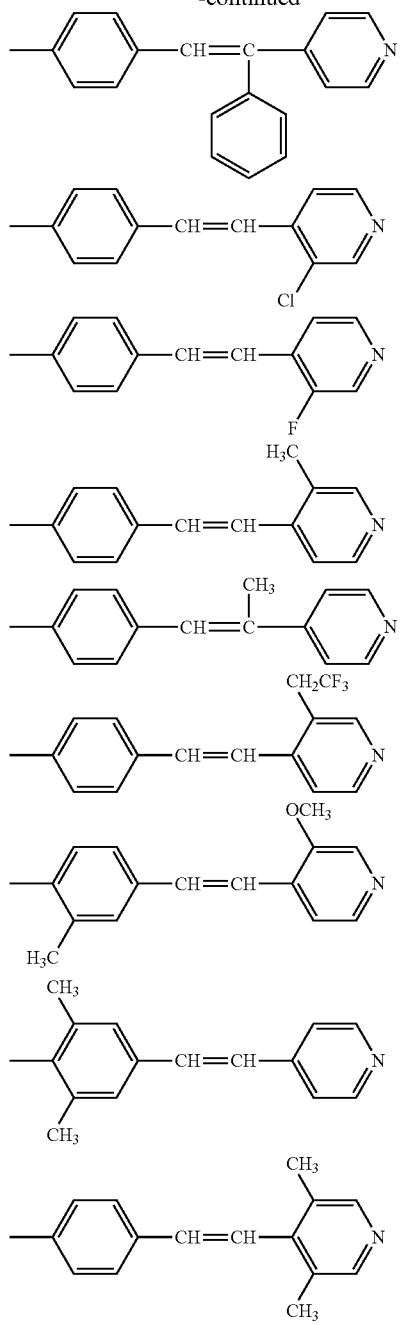
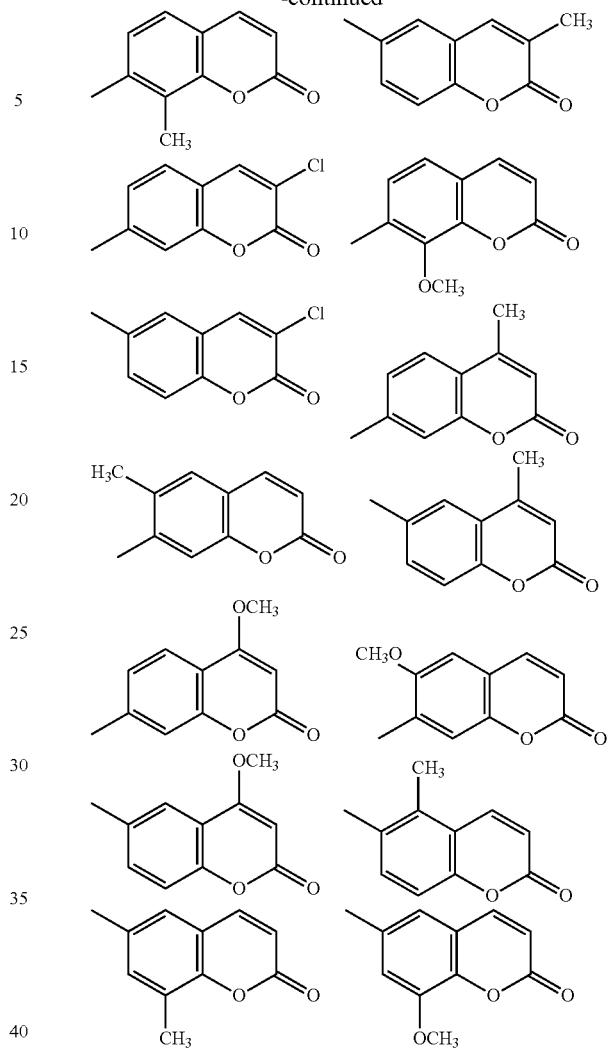

Specific examples of the organic groups represented by the formula (D) can include the followings.

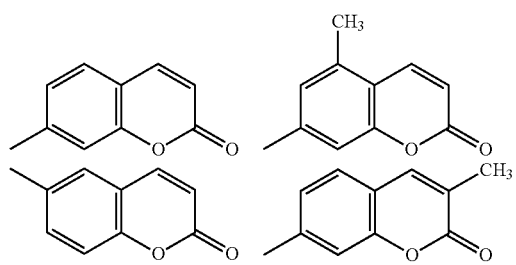

There is no limitation to specific polymers including the repeating units represented by the formulae (1) and (2) used in the present invention, and any polymers can be used as long as they contain an aromatic group, and do not contain a hydroxyl group, an amino group, a thiol group, and the like, which react with acid chloride.

In the present invention, there is no limitation to the molecular weight of the above resin having repeating units represented by the formulae (1) and (2), and, for example, the resin having the molecular weight of 200 to 10,000,000 (g/mol) can be used. From the viewpoint of the solution viscosity and mechanical strength of the obtained resin, the molecular weight is preferably 10,000 to 1,000,000 (g/mol).

The resin having repeating units represented by the above formulae (1) and (2) used in the present invention is obtained by introducing a photocyclizable compound into an aromatic group-containing polymer by Friedel-Crafts acylation. Herein, in the present invention, when a film is formed by introducing a certain amount or more of the photocyclizable compound, the film has excellent planarity and can be photocrosslinked in a short period of time. Accordingly, only with the aromatic group-containing copolymer, the film is poor in the planarity and cannot be photocrosslinked.

In the present invention, the photocyclizable compound shows a cinnamic acid chloride compound represented by the following formula (3), a phenylethenyl benzoic acid chloride compound represented by the following formula (4), a pyridinylethenyl benzoic acid chloride represented by the following formula (5), and a coumarin-6-carboxylate chloride represented by the following formula (6). Among them, the cinnamic acid chloride is preferable because it is easily produced. Furthermore, these compounds can be used in combination of two or more thereof as necessary.

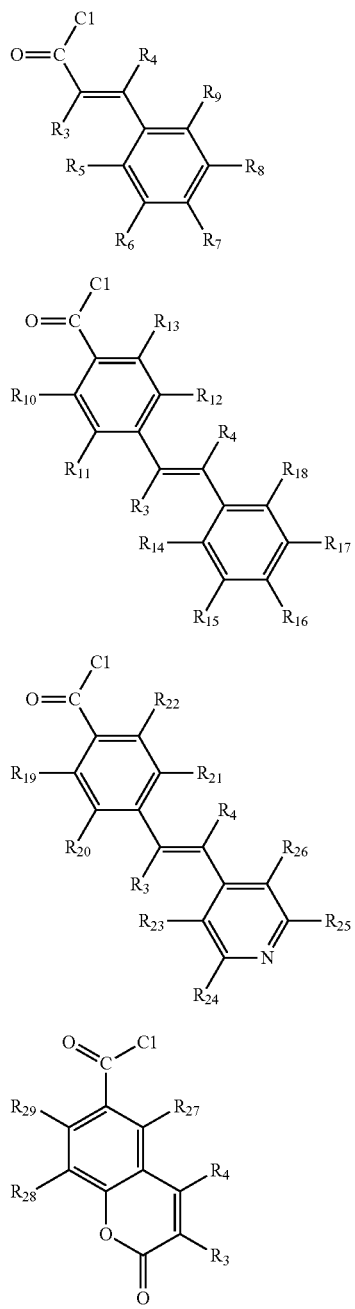

(In the formulae (3) to (6), $R_3$ to $R_{29}$ are the same as those defined in the formulae (A) to (D).)

The charged amount of the aforementioned acid chloride with respect to a resin having the repeating units represented by the formulae (1) and (2) is preferably 0.2 to 2.0 mol and more preferably 0.2 to 1.5 mol with respect to 1 mol of the aromatic group contained in the resin in order to enhance the solubility of the obtained resin in the organic solvent and the storage stability. An amount of the photoreactive group introduced into the aromatic group by reaction is preferably 0.2 to 1.0 mol and further preferably 0.2 to 0.7 mol with respect to 1 mol of an aromatic group contained in the resin from the viewpoint of solubility in organic solvents, storage stability, easiness in photocrosslinking, and a solvent resistance (cracking resistance) of a resin layer after photocrosslinking.

The aromatic group-containing polymer into which a photoreactive group is produced by the Friedel-Crafts acylation is not limited as long as it is inert to the below-mentioned reaction catalyst. Examples of the polymer include polystyrenes such as poly-α-methylstyrene, poly-p-methoxystyrene, and syndio-polystyrene; polyvinylnaphthalene; polyvinylbiphenyl; polyvinylanthracene; polyvinylcarbazole; polyvinyl aryl ketone such as polyvinyl phenyl ketone; a styrene/butadiene copolymer; a styrene/ethylene copolymer; a styrene/acrylonitrile copolymer; a styrene/alkyl acrylate copolymer; a styrene/alkyl methacrylate copolymer; a styrene/α-phenylalkyl acrylate copolymer; a styrene/maleic anhydride copolymer; a styrene/acrylic acid copolymer; a styrene/4-vinylpyridine copolymer; a styrene/trans-1,3-pentadiene copolymer; a styrene/2,4,6-trimethylstyrene copolymer; a styrene/p-acetoxystyrene copolymer; a styrene/vinyl-tris(trimethoxysiloxy)silane copolymer; a styrene/vinyl benzoate copolymer; a styrene/vinyl butyl ether copolymer; a poly(styrene/ethylene/butylene)copolymer; a poly(styrene/ethylene/propylene) copolymer; a poly(styrene/ethylene/propylene/butylene) copolymer; a poly(propylene/styrene) copolymer; a polystyrene-b-poly(ethylene/propylene)-b-polystyrene copolymer; a polystyrene-b-poly(ethylene/butylene)-b-polystyrene copolymer; a polystyrene-b-poly(ethylene/propylene/butylene)-b-polystyrene copolymer; hydrogenated products of a diblock copolymer, a multiblock copolymer, a star polymer, a dendrimer, and a graft copolymer, consisting of polystyrene and polyisoprene; hydrogenated products of a diblock copolymer, a multiblock copolymer, a star polymer, a dendrimer, and a graft copolymer, consisting of polystyrene and polybutadiene; a polystyrene-b-polyisobutylene-b-polystyrene copolymer; a multiblock copolymer, a star polymer, and a dendrimer consisting of polystyrene and polyisobutylene; hydrogenated products of a diblock copolymer, a multiblock copolymer, a star polymer, a dendrimer, and a graft copolymer, consisting of polyvinyl naphthalene and polybutadiene or polyisoprene; a diblock copolymer, a multiblock copolymer, a star polymer, a dendrimer, and a graft copolymer, consisting of polyvinyl naphthalene and polyisobutene; hydrogenated products of a diblock copolymer, a multiblock copolymer, a star polymer, a dendrimer, and a graft copolymer, consisting of polyvinyl anthracene and polybutadiene or polyisoprene; a diblock copolymer, a multiblock copolymer, a star polymer, a dendrimer, and a graft copolymer, consisting of polyvinyl anthracene and polyisobutene; hydrogenated products of a diblock copolymer, a multiblock copolymer, a star polymer, a dendrimer, and a graft copolymer, consisting of polyvinyl biphenyl and polybutadiene or polyisoprene; a diblock copolymer, a multiblock copolymer, a star polymer, a dendrimer, and a graft copolymer, consisting of polyvinyl biphenyl and polyisobutene; a diblock copolymer, a multiblock copolymer, a star polymer, a dendrimer, and a graft copolymer, consisting of poly(styrene-co-vinylnaphthalene) and polyisoprene or polybutadiene, and hydrogenated products thereof; a diblock copolymer, a multiblock copolymer, a star polymer, a dendrimer, and a graft copolymer, consisting of poly(styrene-co-vinylnaphthalene) and polyisobutene; a diblock copolymer, a multiblock copolymer, a star polymer, a dendrimer, and a graft copolymer, consisting of poly(styrene-co-vinyl anthracene) and polyisoprene or polybutadiene, and hydrogenated products thereof; a diblock copolymer, a multiblock copolymer, a star polymer, a dendrimer, and a graft copolymer, consisting of poly(styrene-co-vinyl anthracene) and polyisobutene; a diblock copolymer, a multiblock copolymer, a star polymer, a dendrimer, and a graft copolymer, consisting of poly(styrene-co-vinyl biphenyl) and polyisoprene or polybutadiene, and hydrogenated products thereof; a diblock copolymer, a multiblock copolymer, a star polymer, a dendrimer, and a graft copolymer, consisting of poly(styrene-co-vinyl biphenyl) and polyisobutene; petroleum resin; and the like. However, it is preferable to use a polymer only including aromatic hydrocarbon and aliphatic hydrocarbon in order to lower the dielectric constant and reduce a leakage current. Furthermore, these copolymers can be used in combination of two or more thereof.

The Friedel-Crafts acylation can be performed using a reaction catalyst.

In the present invention, a well-known superacid can be used as the reaction catalyst, and there is no limitation as long as it is a superacid. Examples thereof include trifluoromethane sulfonic acid, fluorosulfonic acid, fluoroantimonic acid, and carborane acid. An addition amount of the catalyst is preferably 0.1 to 1.5 times molar as that of the above-mentioned acid chloride for avoiding complication of the neutralization operation after the reaction and for preventing the reaction rate from being reduced.

The Friedel-Crafts acylation is an exothermic reaction, and may generate side reaction of crosslinking when the photoreactive group is heated in this reaction system. Therefore, in order to suppress the side reaction, the present invention is carried out by the solution reaction that can easily control the reaction temperature. In the present invention, a reaction solvent to be used in the solution reaction is not necessarily limited as long as it is stable with respect to the Friedel-Crafts reaction, and examples thereof include a chlorinated system hydrocarbon solvent, an aliphatic hydrocarbon solvent, sulfur-containing solvent, a nitrile solvent, and the like, being inactive to the reaction and which has been satisfactorily dehydrated, are suitably used. Examples of the chlorinated hydrocarbon solvent include, methylene chloride, carbon tetrachloride, 1,1,2-trichloroethane, chloroform, and the like; examples of the aliphatic hydrocarbon solvent include cyclohexane, and the like; examples of the sulfur-containing solvent include carbon disulfide, dimethyl sulfoxide, dimethyl sulfate, dimethyl sulfone, and the like; examples of the nitrile solvent include acetonitrile.

In the Friedel-Crafts acylation, the reaction temperature is not particularly limited, but the temperature is preferably 0 to 40° C. from an economical viewpoint according to cooling and heating, and the temperature is further preferably 0 to 15° C. from the viewpoint of suppressing of generation of microgel. Furthermore, the Friedel-Crafts acylation can be performed at a refluxing temperature of a solvent to be used as necessary, but the temperature is less than 200° C.

In the Friedel-Crafts acylation, the reaction time is not particularly limited, and the reaction time may be, for example, 5 hours to 100 hours. From the viewpoint of the reaction rate and an economical viewpoint, the reaction time is preferably 10 hours to 50 hours.

Furthermore, in the resin having the repeating units represented by the formulae (1) and (2), the polymer molecule may contain a structure based on the cyclization of a photoreactive group as long as the solubility is not impaired.

The structure based on the cyclization of a photoreactive group may include structures represented by the following formulae (7) to (10).

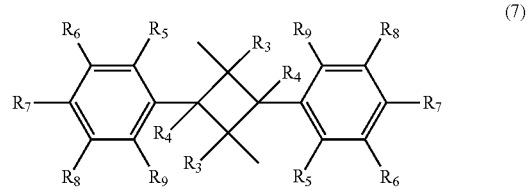

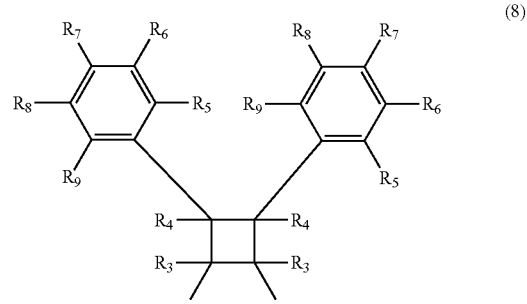

(In the formulae (7) and (8), $R_3$ to $R_9$ are the same as those in the formula (3))

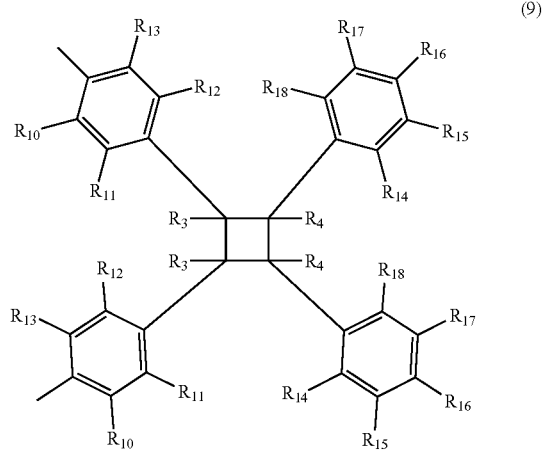

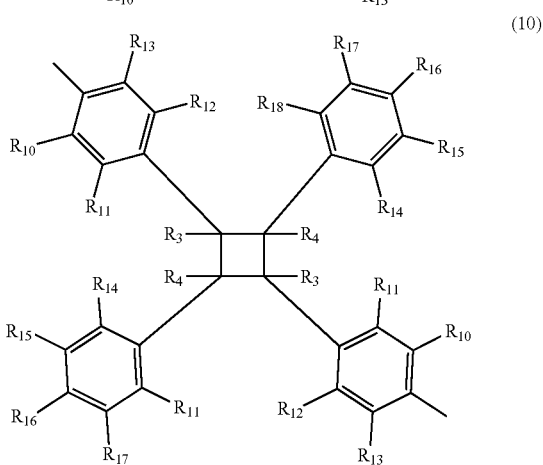

(In the formulae (9) and (10), $R_3$, $R_4$, $R_{10}$ to $R_{18}$ are the same as those in the formula (4)).

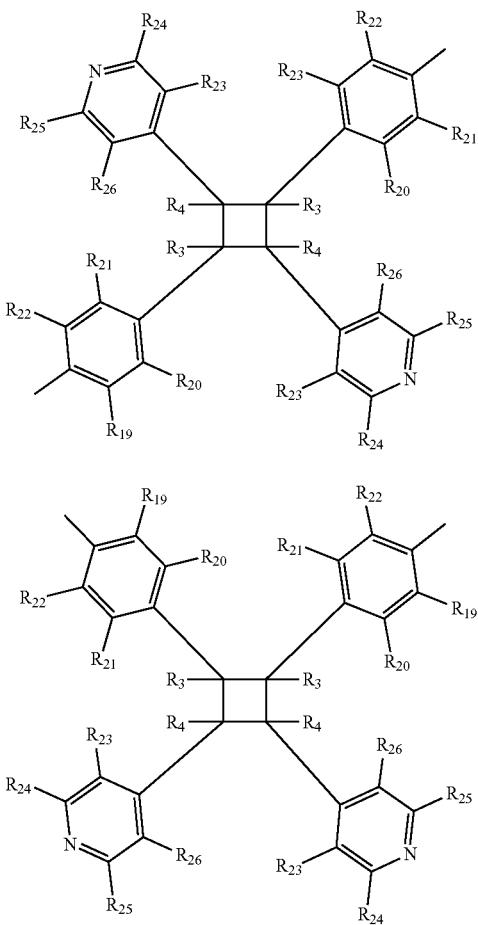

(11)

(12)

(In the formulae (11) and (12), $R_3$, $R_4$, $R_{19}$ to $R_{26}$ are the same as those in the formula (5)).

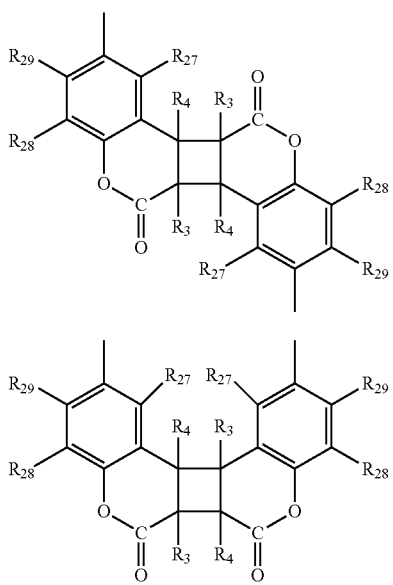

(13)

(14)

(In the formulae (13) and (14), $R_3$, $R_4$, $R_{27}$ to $R_{29}$ are the same as those in the formula (6)). Furthermore, the resin including the repeating units represented by the formulae (1) and (2) may include, for example, a dimerized product of the photoreactive group shown below.

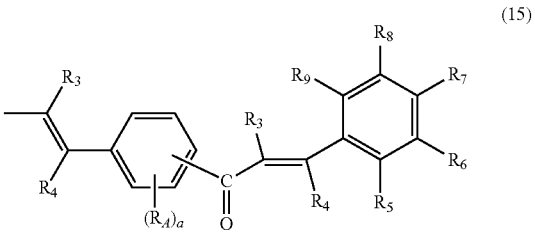

(15)

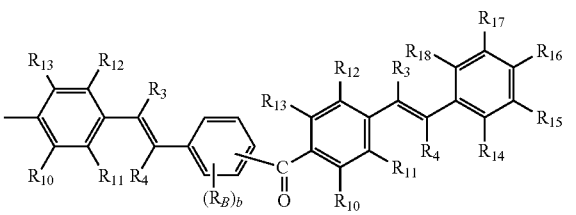

(16)

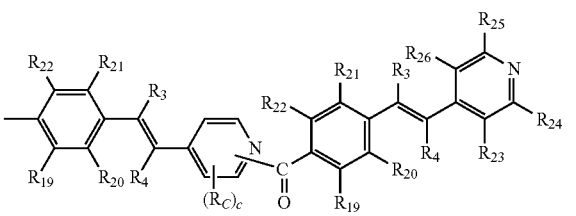

(17)

(In the formulae (15), (16), and (17), $R_3$ and $R_4$ to $R_{26}$ are the same as those defined in the formulae (A) to (C).

a, b, and c are an integer from 0 to 4, $R_A$ is a number of substituents selected from $R_5$ to $R_9$ defined in the formula (A), $R_B$ is b number of substituents selected from $R_{14}$ to $R_{18}$ defined in the formula (B), and $R_C$ is c number of substituents selected from $R_{23}$ to $R_{26}$ defined in the formula (C).)

In the present invention, when Z in the formula (2) is the organic group represented by the formula (A), the resin having the repeating units represented by the formulae (1) and (2) may be a resin having repeating units represented by the above formulae (1) and (2), and further having the repeating units represented by the formula (18). At this time, when a part of the repeating units of the formula (2) is a repeating unit of the formula (18), it is possible to suppress generation of microgel, and thus, a resin excellent in productivity is obtained.

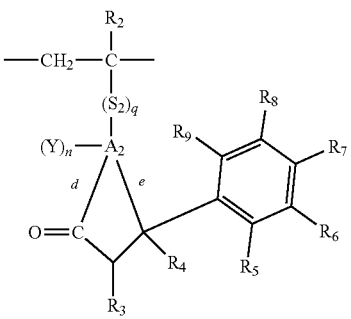

(18)

(In the formula (18), $R_2$, $S_2$, $A_2$, and Y represent a substituent defined in the formula (2); q represents an integer defined in the formula (2); n represents an integer from 0 to (t-4). Herein, t represents the total number of the carbon atoms constituting $A_2$. Furthermore, d and e represent single bonds that are located in the ortho positions to each other (bonded to adjacent carbons) on the aromatic group $A_2$. Furthermore, $R_3$ to $R_9$ are the same as those defined in the formula (A)).

In the formula (18), n represents an integer from 0 to (t-4). Herein, t represents the total number of the carbon atoms constituting $A_2$. Furthermore, d and e represent single bonds that are located in the ortho positions to each other (bonded to adjacent carbons) on the aromatic group $A_2$.

Furthermore, the resin having the repeating units represented by the formulae (1) and (2) include the repeating unit represented by the above formulae (1) and (2), and furthermore, may be a resin having the repeating unit represented by the formula (19). At this time, in the case of a lyophilic/liquid-repellent patterned film, liquid-repellency is improved, and resin, in which resolution when a microelectrode is formed is more excellent, is obtained.

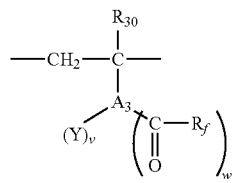

(19)

(In the formula (19), $A_3$ represents a C6-C19 aryl group; Y represents substituent defined in the formula (1); $R_{30}$ represents hydrogen or a C1-C6 alkyl group; $R_f$ represents a C1-C18 fluoroalkyl group; v represents an integer from 0 to (u-2); w represents an integer from 1 to (u-v-1). Herein, u represents the number of carbon atoms constituting $A_3$).

In the formula (19), $A_3$ represents a C6-C19 aryl group.

The C6-C19 aryl group in $A_3$ represented by the formula (19) is not particularly limited, and examples thereof include a phenyl group, a naphthyl group, an anthryl group, a biphenyl group, and the like.

In the formula (19), Y represents the same organic group as that defined in the formula (1).

In the formula (19), $R_{30}$ represents hydrogen or a C1-C6 alkyl group.

The C1-C6 alkyl group in $R_{30}$ represented by the formula (19) is not particularly limited, and examples thereof include a methyl group, an ethyl group, a n-propyl group, an isopropyl group, a n-butyl group, and the like.

In the formula (19), $R_f$ represents a C1-C18 fluoroalkyl group.

The C1-C18 fluoroalkyl group in $R_f$ represented by the formula (19) is not particularly limited, and examples thereof include a linear perfluoroalkyl group such as a trifluoromethyl group, a perfluoroethyl group, a perfluoropropyl group, a perfluorobutyl group, a perfluoropentyl group, a perfluorohexyl group, a perfluoroheptyl group, a perfluorooctyl group, a perfluorononyl group, a perfluorodecyl group, a perfluorododecyl group, and a perfluorooctadecyl group; branched perfluoroalkyl group such as a perfluoroisopropyl group, a perfluoroisobutyl group, a perfluoro-sec-butyl group, a perfluoro-tert-butyl group, and a perfluoroneopentyl group; a cyclic perfluoroalkyl group such as a perfluorocyclopropyl group, a perfluorocyclobutyl group, a perfluorocyclopentyl group, and a perfluorocyclohexyl group; a partially fluoridated semifluoroalkyl group such as a 1,1,1-perfluoroethyl group, a 1,1,1,2,2-pentafluoropropyl group, a 1,1,1,2,2,3,3-heptafluorobutyl group, a 2-(perfluorohexyl)ethyl group, and a 2-(perfluorooctyl)ethyl group.

In the formula (19), v represents an integer from 0 to (u-2), and m represents an integer from 1 to (u-v-1). Herein, u represents the number of carbons constituting $A_3$.

A solution obtained by dissolving the resin having repeating units represented by the above formulae (1) and (2) in a solvent can be applied or printed on various substrate.

As the solvent, a solvent can be used without any limitation as long as it dissolves the resin, and examples of the solvent include aromatic hydrocarbons such as cyclohexane, benzene, toluene, xylene, ethylbenzene, isopropylbenzene, n-hexylbenzene, tetralin, decalin, isopropylbenzene, and chlorobenzene; chlorinated aliphatic hydrocarbon compounds such as methylene chloride and 1,1,2-trichloroethylene; aliphatic cyclic ether compounds such as tetrahydrofuran and dioxane; ketone compound such as methyl ethyl ketone, and cyclohexanone; ester compounds such as ethyl acetate, dimethyl phthalate, methyl salicylate, and amyl acetate; alcohols such as n-butanol, ethanol, and iso-butanol; 1-nitropropane, carbon disulfide, and limonene. These solvents can be used in a mixture thereof as necessary.

The resin according to the present invention can be printed by using, for example, spin coating, drop casting, dip coating, doctor blade coating, pad printing, squeegee coating, roll coating, rod bar coating, air knife coating, wire bar coating, flow coating, gravure printing, flexographic printing, screen printing, ink jet printing, relief reversal printing, and the like. Note here that since the insulating film of the present invention are formed by using these methods, the insulating film of the present invention is required to be excellent in solubility in commonly-used solvents.

When the resin according to the present invention is used as an insulating film, the resin can be used in a state in which the resin formed into a film, or as a crosslinked product which has been photocrosslinked (photocylized) as necessary. Note here that in the present invention, when the resin is used as an insulating film without photocrosslinking after the resin formed into a film, the film needs to have good solubility in the commonly-used solvent to be used for film formation, and to form an organic semiconductor layer on the top of the film using a solvent that is different from the solvent which is used for film formation. At this time, when the film has solvent resistance (cracking resistance) with respect to an organic semiconductor solution, the film can be used in a state in which the film is formed as it is as an insulating film. Note here that when the film is not excellent in the solvent resistance (cracking resistance), film formation by a printing method cannot be performed, so that film formation needs to be performed by methods such as a vapor deposition method that is less economical as compared with the printing method.

When the resin according to the present invention is used as an insulating film, photocrosslinking (photocyclization) uses radiation, for example, ultraviolet ray having a wavelength of 245 to 350 nm. The irradiation amount appropriately varies depending on the composition of resins, but it is, for example, 150 to 3000 $mJ/cm^2$, and preferably 50 to 1000 $mJ/cm^2$ for preventing the cross-linking degree from being reduced, and improving economy by shortening process. Irradiation of ultraviolet ray is usually carried out in the atmospheric air, but can be carried out in an inert gas as necessary, or also in the air flow of a certain amount of an inert gas. Photocrosslinking reaction can be promoted by adding a photosensitizer as necessary. The photosensitizer used is not limited, and examples thereof include a benzophenone compound, an anthracene compound, an anthraquinone compound, thioxanthone compound, nitrophenyl compound, and the like, and benzophenone compound having high compatibility with the resin used in the present invention is preferable. Furthermore, the sensitizer can be used in combination of two or more thereof as necessary.

The resin of the present invention can be crosslinked by ultraviolet ray, but may be heated as necessary. A temperature when heating is carried out in addition to irradiation with ultraviolet ray is not particularly limited, but the temperature is preferably 120° C. or less in order to avoid thermal deformation of the resin.

Furthermore, the resin of the present invention can be crosslinked with high efficiency in a short period of time. The time required for crosslinking can be within 5 minutes. Note here that from the viewpoint of controlling the crosslinking time, the time required for crosslinking is preferably within 1 to 2 minutes.

The resin of the present invention is formed into a film, and the film can be used for a gate insulating layer (a polymer dielectric layer) in the organic field effect transistor (OFET). The organic field effect transistor can be obtained, for example, by stacking an organic semiconductor layer on which a source electrode and a drain electrode are attached and a gate electrode via a gate insulating layer (a polymer dielectric layer) on a substrate.

In an insulating film obtained from the resin of the present invention, since formation of fine holes (pinholes) that cause leakage, a leakage current is low. Furthermore, when the insulating film is used as a polymer dielectric layer, from the viewpoint of practicality as an organic field effect transistor (OFET) device, the leakage current is preferably 0.01 nA or less The insulating film obtained from the resin of the present invention has excellent wettability to a solvent, when the insulating film is used as a gate insulating layer (polymer dielectric layer), in a bottom-gate bottom-contact (BGBC) type and a top-gate bottom-contact type organic field effect transistor device, coating of an appropriate amount of organic semiconductor solution covering a S (source) electrode and a D (drain) electrode on the layer allows the electrode to be covered entirely.

The insulating film obtained from the resin of the present invention has excellent planarity. When the insulating film is used as the gate insulating layer (a polymer dielectric layer, from the viewpoint of the planarity, the surface roughness (Ra) is preferably 0.5 nm or less.

When the insulating film obtained from the resin of the present invention is used as a gate insulating layer (a polymer dielectric layer), from the viewpoint of practicality as the organic field effect transistor (OFET) device, the threshold voltage of the OFET device is preferably more than 0 and 2.0 V or less, or −2.0 V or more and less than 0 V.

When the insulating film obtained from the resin of the present invention is used as a gate insulating layer (a polymer dielectric layer), from the viewpoint of the practicality as the organic field effect transistor (OFET) device, the mobility of the OFET device is preferably 0.20 cm$^2$/Vs or more.

When the insulating film obtained from the resin of the present invention is used as a gate insulating layer (a polymer dielectric layer), from the viewpoint of the practicality as the organic field effect transistor (OFET) device, the ratio of on current/off current of the OFET device is preferably $10^6$ or more.

When the insulating film obtained from the resin of the present invention is used as a gate insulating layer (a polymer dielectric layer), from the viewpoint of the practicality as the organic field effect transistor (OFET) device, preferably there is no hysteresis between the source current and the drain current of the OFET device.

When the insulating film obtained from the resin of the present invention is used as a gate insulating layer (a polymer dielectric layer), from the viewpoint of the practicality as the organic field effect transistor (OFET) device, the breakdown voltage of the OFET device is preferably 4 MV/cm or more.

In the present invention, the organic field effect transistor (OFET) may be any of a bottom-gate bottom-contact (BGBC) type, a bottom-gate top-contact (BGTC) type, a top-gate bottom-contact (TGBC) type, and a top-gate top-contact (TGTC) type. Herein, among the organic field effect transistors having these various structures, for example, a structure of a bottom-gate bottom-contact (BGBC) type device is shown in FIG. 1.

The resin of the present invention is suitably used as a planarization film containing the resin of the present invention and/or the crosslinked product of the resin of the present invention, and particularly suitably used as an insulating planarization film capable of being continuously printed. Herein, the planarization film is a film made of an insulating resin, which is applied on a substrate for reducing the surface roughness of the substrate itself.

A planarization film obtained from the resin of the present invention can be continuously printed when it is dissolved in the aforementioned organic solvent, and is excellent in insulation property and planarity, and can be particularly suitably used as a lyophilic/liquid-repellent patterned film. Herein, the lyophilic/liquid-repellent patterning is a technology of patterning a plastic surface by hydrophilizing with vacuum ultraviolet rays (VUV), and a film having surface that has been patterned using the technology is referred to as a lyophilic/liquid-repellent patterned film. Unlike a conventional film using a parylene film, the lyophilic/liquid-repellent film of the present invention is suitable from the viewpoint that it is possible to prevent generation of defects in coating of an aqueous metal nanoink.

In the present invention, it is preferable that in the lyophilic/liquid-repellent patterning, a lyophilic/liquid-repellent patterned film is irradiated with a vacuum ultraviolet ray (VUV) having a wavelength of 10 nm to 200 nm via a photomask having a chromium pattern. A distance between the light source and the film, and a distance between the mask and the film can be appropriately selected depending on the composition of the lyophilic/liquid-repellent patterned film used. Furthermore, irradiation with VUV is carried out under gas having various compositions from atmospheric air to nitrogen. The VUV irradiation time is not limited as long as excellent lyophilic/liquid-repellent patterning can be carried out, but the time is preferably in a range from 100 to 1000 seconds because deterioration of the film can be suitably prevented and sufficient lyophilic/liquid-repellent patterning can be carried out.

By the lyophilic/liquid-repellent patterning, a hydrophilic pattern is drawn on the film having hydrophobicity. In this case, however, the contact angle of the hydrophobic region and the contact angle of hydrophilic region are preferably 100° or more and 20° or less, respectively, with respect to water, and a difference between these contact angles is preferably 80° or more. Furthermore, a surface tension difference between the hydrophobic region and the hydrophilic region is preferably 40 mN/m. When drying and heat baking are carried out in this state, fine metal wiring patterns having a micrometer size can be formed more suitably. The drying temperature and the heat baking temperature are not limited as long as there is no influence on the substrate and the lyophilic/liquid-repellent patterned film. The drying temperature is suitably 10 to 50° C., and heat baking temperature is suitably 100 to 180° C.

The resolution of the lyophilic/liquid-repellent patterned film can be appropriately selected depending on the use of application, but from the viewpoint of practicality, the resolution is preferably 10 μm or less. Herein, the "resolution" in the present invention refers to the minimum value of A at which a wiring having a shape as a mask can be formed when the wiring is formed by a metal nanoink after photo-patterning is carried out using a mask in which linear electrode wirings (lines) each having a width of A micron are arranged at an equal interval of A micron. In this case, the resolution of line-and-space is A micron.

When the resin of the present invention is used as the lyophilic/liquid-repellent patterned film, the metal nanoink that can be used in the present invention, and the concentration of metal particles contained in the ink are not limited as long as the low-resistance metal wiring can be formed. Examples the nanoink include an ink including metal nanoparticles of gold, silver, platinum, and the like. A solid content of the ink is, for example, 5 to 50 wt %. Furthermore, examples of a medium in which the metal nanoparticles are dispersed include an ink using water, or a water/alcohol mixture solvent. Types of alcohols are not limited as long as they are compatible with water, and examples thereof include methanol, ethanol, and the like.

When an electrode is formed using a planarization film obtained from the resin of the present invention as a lyophilic/liquid-repellent patterned film, from the viewpoint of the practicality of the organic field effect transistor (OFET) device including the electrode, a threshold voltage of the OFET device is preferably more than 0 and 2.0 V or less, or −8.0 V or more and less than 0 V, and more preferably more than 0 and 2.0 V or less, or −2.0 V or more and less than 0 V.

When an electrode is formed using a planarization film obtained from the resin of the present invention as a lyophilic/liquid-repellent patterned film, from the viewpoint of practicality of an organic field effect transistor (OFET) device including the electrode, the mobility of the OFET device is preferably 0.20 cm$^2$/Vs or more.

When an electrode is formed using a planarization film obtained from the resin of the present invention as a lyophilic/liquid-repellent patterned film, from the viewpoint of the practicality as the organic field effect transistor (OFET) device including the electrode, the ratio of on-current/off-current of the OFET device is preferably $10^6$ or more.

When an electrode is formed using a planarization film obtained from the resin of the present invention as a lyophilic/liquid-repellent patterned film, from the viewpoint of the practicality as the organic field effect transistor (OFET) device including the electrode, preferably there is no hysteresis between the source current and the drain current of the OFET device.

The substrate that can be used in the OFET is not particularly limited as long as it can secure sufficient planarity that can prepare an element, and examples thereof include inorganic material substrate such as glass, quartz, aluminum oxide, highly doped silicon, silicon oxide, tantalum dioxide, tantalum pentoxide, and indium tin oxide; plastic; metal such as gold, copper, chromium, titanium, and aluminum; ceramics; coated paper; surface coating nonwoven, and the like, and may be a composite material of these materials, or a material obtained by multi-layering these materials. In order to adjust the surface tension, it is also possible to carry out coating of these materials surface.

Examples of the plastic used as the substrate include poly(ethylene terephthalate), poly(ethylene naphthalate), triacetyl cellulose, polycarbonate, poly(methyl acrylate), poly (methyl methacrylate), poly(vinyl chloride), polyethylene, ethylene/vinyl acetate copolymer, poly(methyl pentene-1), polypropylene, cyclic polyolefin, fluorinated cyclic polyolefins, polystyrene, polyimide, poly(vinyl phenol), poly(vinyl alcohol), poly(diisopropyl fumarate), poly(diethyl fumarate), poly(diisopropyl maleate), poly(ether sulfone), poly(phenylene sulfide), poly(phenylene ether), polyester elastomer, polyurethane elastomer, polyolefin elastomer, polyamide elastomer, styrene block copolymer, and the like. Furthermore, a substrate in which two or more of the above-mentioned plastics are stacked can be used.

Examples of a conductive gate electrode, a source electrode, or a drain electrode which can be used in the present invention include conductive materials such as gold, silver, aluminum, copper, titanium, platinum, chromium, polysilicon, silicide, indium tin oxide (ITO), tin oxide, and the like. Furthermore, these conductive materials may be used in a state in which a plurality of conductive materials are stacked.

A method for forming an electrode is not particularly limited, and examples of the method include vapor deposition, radio frequency sputtering, electron beam sputtering, and the like. With use of ink in which nanoparticles of the above conductive material are dissolved in water or an organic solvent, it is possible to employ solution spin coating, drop casting, dip coating, doctor blading, die coating, pad printing, roll coating, gravure printing, flexographic printing, screen printing, ink jet printing, relief reversal printing, and the like. Furthermore, treatment of allowing fluoroalkylthiol, fluoroarylthiol, and the like, to be adsorbed on the electrode may be carried out as necessary.

The organic semiconductor that can be used in the present invention is not limited, and N-type and P-type organic semiconductors can be used. A bipolar transistor in which N-type and P-type are combined can be used, and examples thereof are shown in the formulae (F-1) to (F-10), and the like.

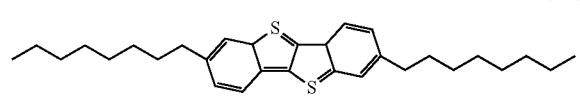

(F-1)

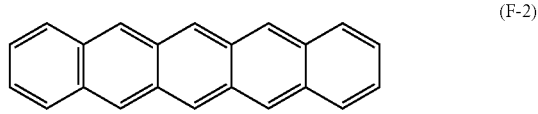

(F-2)

(F-3)
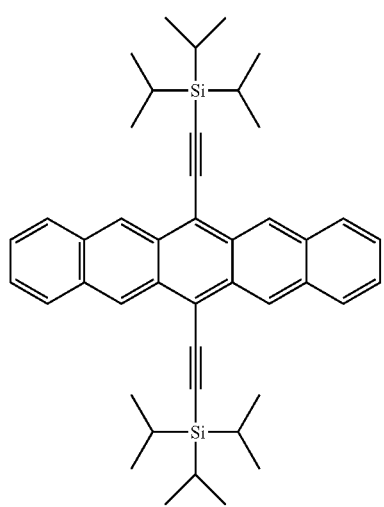
(F-4)
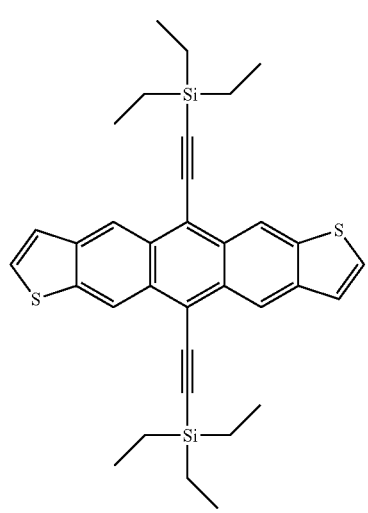
(F-5)
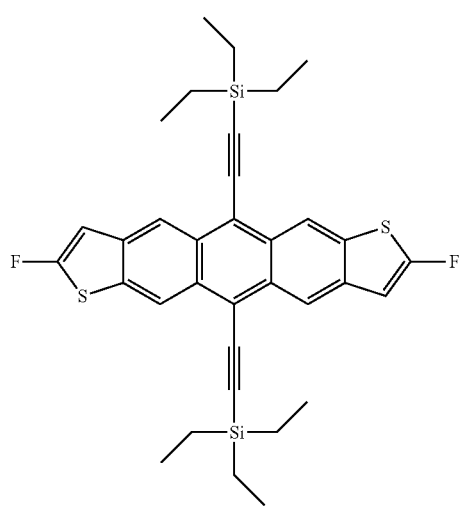
(F-6)
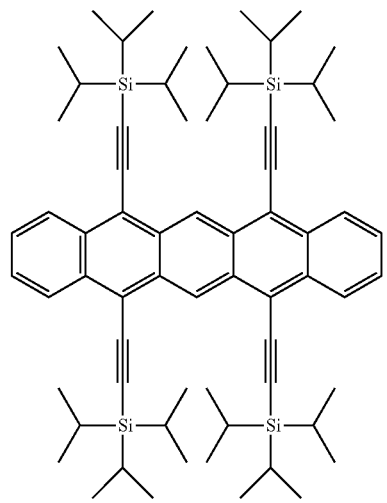
(F-7)
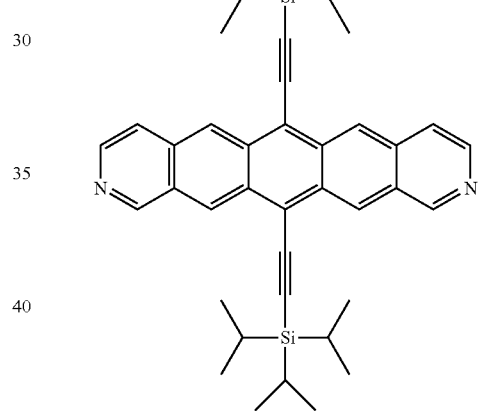
(F-8)
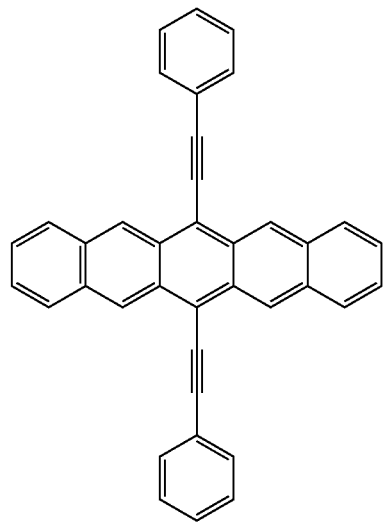

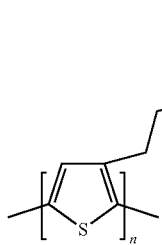

(F-9)

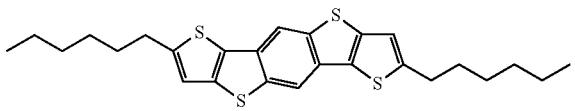

(F-10)

In the present invention, both low molecular weight organic semiconductors and polymeric organic semiconductors can be used, and a mixture thereof can be used.

In the present invention, examples of the method for forming an organic semiconductor layer include a method of vacuum-depositing an organic semiconductor, or a method of dissolving an organic semiconductor in an organic solvent and performing coating and printing thereof. However, the method is not limited as long as the method can form a thin film of an organic semiconductor layer. A solution concentration when coating or printing of a solution in which an organic semiconductor layer is dissolved in an organic solvent is different depending on the structure of the organic semiconductor and the solvent used, but from the viewpoint of formation of uniform semiconductor layer and reduction in a thickness of the layer, the concentration is preferably 0.5% by weight to 5% by weight. The organic solvent at this time is not limited as long as the organic semiconductor is dissolved at a certain concentration capable of forming a film, and examples of the organic solvent include hexane, heptane, octane, decane, dodecane, tetradecane, decalin, indane, 1-methylnaphthalene, 2-ethylnaphthalene, 1,4-dimethylnaphthalene, dimethylnaphthalene isomer mixture, toluene, xylene, ethylbenzene, 1,2,4-trimethylbenzene, mesitylene, isopropylbenzene, pentylbenzene, hexylbenzene, tetralin, octylbenzene, cyclohexylbenzene, 1,2-dichlorobenzene, 1,3-dichlorobenzene, 1,4-dichlorobenzene, trichlorobenzene, 1,2-dimethoxybenzene, 1,3-dimethoxybenzene, γ-butyrolactone, 1,3-butylene glycol, ethylene glycol, benzyl alcohol, glycerine, cyclohexanol acetate, 3-methoxybutyl acetate, ethylene glycol monomethyl ether acetate, ethylene glycol monobutyl ether acetate, propylene glycol monomethyl ether acetate, anisole, cyclohexanone, mesitylene, dipropylene glycol diacetate, dipropylene glycol methyl ether acetate, diethylene glycol monobutyl ether acetate, diethylene glycol monoethyl ether acetate, 1,6-hexanediol diacetate, 1,3-butylene glycol diacetate, 1,4-butanediol diacetate, ethyl acetate, phenyl acetate, dipropylene glycol dimethyl ether, dipropylene glycol methyl-n-propyl ether, tetradecahydro-phenanthrene, 1,2,3,4,5,6,7,8-octahydrophenanthrene, decahydro-2-naphthol, 1,2,3,4-tetrahydro-l-naphthol, α-terpineol, isophorone triacetin decahydro-2-naphthol, dipropylene glycol dimethyl ether, 2,6-dimethyl anisole, 1,2-dimethyl anisole, 2,3-dimethyl anisole, 3,4 dimethyl anisole, 1-benzothiophene, 3-methylbenzothiophene, 1,2-dichloroethane, 1,1,2,2-tetrachloroethane, chloroform, dichloromethane, tetrahydrofuran, 1,2-dimethoxyethane, dioxane, cyclohexanone, acetone, methyl ethyl ketone, diethyl ketone, diisopropyl ketone, acetophenone, N,N-dimethylformamide, N-methyl-2-pyrrolidone, limonene, and the like. However, in order to obtain a crystal film having preferable property, a solvent having high solubility of an organic semiconductor, and a boiling point of 100° C. or more is suitable, and preferable examples thereof include xylene, isopropyl benzene, anisole, cyclohexanone, mesitylene, 1,2-dichlorobenzene, 3,4-dimethylanisole, pentylbenzene, tetralin, cyclohexylbenzene, and decahydro-2-naphthol. Furthermore, a solvent mixture including two or more types of the aforementioned solvents can be used.

To the organic semiconductor layer, as necessary, various types of organic/inorganic polymers or oligomers, or organic/inorganic nanoparticles can be added as a dispersion liquid in which solid or nanoparticles are dispersed in water or an organic solvent. The polymer dielectric layer is coated with a polymer solution, so that a protective film can be formed. In addition, as necessary, on this protective film, various moisture-proof coating, light-proof coating, can be carried out.

Effects of the Invention

The present invention can provide a resin suitable for a polymer dielectric layer having excellent performance in terms of solubility in commonly-used solvents, crosslinking temperature, time required for crosslinking, solvent resistance (cracking resistance), breakdown voltage, leakage current, solvent wettability, planarity when the resin is formed into a film.

EXAMPLES

Figure 1:
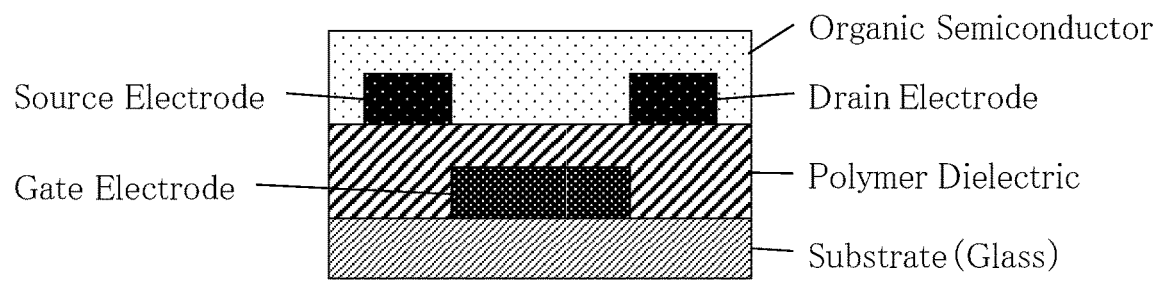
FIG. 1 is a view showing a cross-sectional shape of a bottom-gate bottom-contact (BGBC) type device.

Hereinafter, the present invention is described in more detail with reference to Examples, but the present invention is not limited to these Examples alone. Note here that the organic semiconductor (di-n-hexyl dithienobenzodithiophene) used in Examples was synthesized according to the production method of Japanese Patent Application Unexamined Publication No. 2015-224238. Among the use photocyclizable compounds, 2-oxo-2H-1-benzopyran-6-carbonyl chloride (represented by the following formula (G)) was synthesized according to CN103183634, 4-[2-(4-pyridinyl) ethenyl]benzoyl chloride (represented by the following formula (H)) was synthesized according to the method described in Journal für Practitioner tipper Chez Chemie, Vol. 6, page 72 (1958). Furthermore, cinnamic acid chloride which is a reagent made of Tokyo Chemical Industry Co., Ltd (represented by the following formula (I)) was used. A compound (represented by the following formula (J)) having a fluoroalkyl group was synthesized according to the method described in Journal of Fluorine Chemistry, vol. 131, page 621 (2010). Furthermore, as Ag nanoink (ink containing silver nanoparticle), silver nanocolloid H-1 manufactured by Mitsubishi Materials was used.

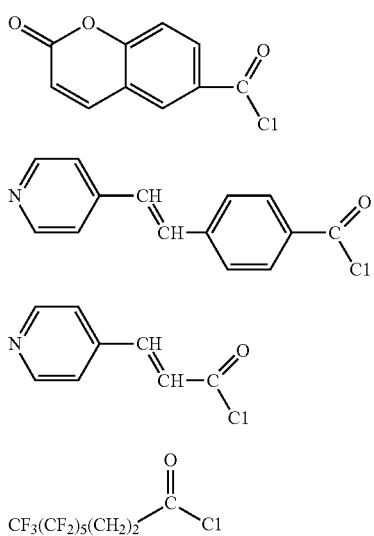

In Examples, NMR, spin coating, film thickness measurement, dispenser printing, UV irradiation, vacuum deposition, the amount of UV irradiation necessary for crosslinking, wettability of a polymer dielectric layer to a solvent, breakdown voltage, evaluation of an OFET device, evaluation of solvent resistance (cracking resistance) were carried out under the following conditions and using the following devices.

<NMR>
NMR was measured using JNM-ECZ400S FT-NMR (manufactured by JEOL Ltd.). Note here that the molar fraction X of a photocyclization group in an aromatic group can be calculated by the following expression using integrated intensity of a peak obtained by the $^1$H-NMR measurement.

$$X=(P-1)\times I_2/\{(N+1)\times I_2 - M\times I_1\}$$

(herein, $I_1$ represents an integral value of peaks that are present in $\delta 0.8$ to $\delta 2.04$ ppm, $I_2$ represents an integral value of peaks that are present in $\delta 6.50$ to $\delta 7.6$ ppm, P represents the total number of hydrogen atoms that are present in the photocyclization group, N represents the number of the total of methylene, methine, and methyl groups, and M represents the total number of hydrogen atoms of the aromatic group.)

<Spin Coating>
MS-A100 manufactured by Mikasa Co., Ltd was used.

<Film Thickness Measurement>
Measurement was carried out using DektakXT stylus profiler manufactured by Bruker Corporation.

<Dispenser Printing>
IMAGE MASTER 350PC SMART manufactured by Musashi Engineering, Inc. was used.

<UV Irradiation>
UV irradiation was carried out using UV-System, CSN-40A-2 manufactured by GS Yuasa Corporation under the condition of UV intensity of 4.0 kW, and UV irradiation time was adjusted by changing the conveying speed.

<Deposition>
Small-sized vacuum evaporation equipment VTR-350M/ERH manufactured by ULVAC KIKO was used.

<Amount of UV Irradiation Necessary for Crosslinking>
On a washed and dried glass having a size of 30×30 mm$^2$ (Eagle XG manufactured by Corning Inc.), a resin solution was applied to form a spin-coated film having a film thickness of 500 nm, followed by drying sufficiently. Initial film thickness (A) at this time was measured, and a crosslinked film obtained with an amount of UV irradiation changed was soaked in toluene for one hour, and dried. Then, a film thickness (B) of the resultant film was measured. Using these film thicknesses, from the following expression:

Film remaining rate=Film thickness (B)/Initial film thickness(A)×100, the amount of UV irradiation in which the film remaining rate was 95% or more was made to be a UV irradiation amount necessary for crosslinking.

<Wettability of a Polymer Dielectric Layer to Solvent>
Five types of solvents (toluene, tetralin, xylene, mesitylene, and chlorobenzene) having different surface tension was dropped in an amount of 1 μL onto a crosslinked film of a resin. When coating of an appropriate amount of the organic semiconductor solution covering the S electrode and the D electrode is carried out, if a shape at instant time of coating of droplet is maintained or wettability is widened, the solution can cover the electrodes entirely. Thus, this case was evaluated as good (score 1). On the other hand, when the droplet was contracted, and/or moved, electrode was not covered. Therefore, a case where the liquid was contracted and/or moved was evaluated as failure (score 0). When good results are obtained in all the solvents, the score was 5.

<Breakdown Voltage>
On the washed and dried glass having a size of 30×30 mm$^2$ (Eagle XG manufactured by Corning Inc.), silver was deposited to form an electrode having a thickness of 30 nm. Thereafter, on the substrate on which the electrode was formed, a film of a dielectric material (insulator) was formed, gold electrode was deposited on the dielectric layer to prepare an MIM capacitor, and a voltage was applied between the above silver-gold electrodes. A voltage at which an electric current starts to flow inside the dielectric layer by dielectric breakdown was measured, and a value obtained by dividing the value by a thickness of the measured dielectric layer referred to a breakdown voltage.

<Evaluation of FET Device>
A bottom-gate bottom-contact (BGBC) type device as one embodiment of the organic field effect transistor was prepared, and mobility, leakage current, on-current/off-current ratio, hysteresis of source/drain current, and threshold voltage were evaluated using Semiconductor Parameter Analyzer SCS4200 manufactured by Keithley Instruments, Inc., with a source-drain voltage be −60 volts and a gate voltage changed.

<Solvent Resistance (Cracking Resistance)>
On a PET film (manufacture by Teijin DuPont Films Japan) having a size of 5 cm×5 cm and a thickness of 100 micron, an insulating film having a thickness of 600 nm was formed using a spin coater, and then a photocyclization (photocrosslinking) was carried out. The film was soaked in toluene for one hour, then the film was taken out to volatilize toluene at ordinary temperature, and the presence or absence of micro-cracks on the surface of the film was checked by observing the surface of the film using a shape-measurement laser microscope (VK-X100 manufactured by Keyence Corporation).

Hereinafter, Examples are shown. All of reaction, purification, and drying were carried out under yellow light or under shading. Note here that Examples were carried out under yellow light or under shading, in order to prevent photocyclization reaction of a photocyclizable compound and photocyclization reaction of a resin into which a photocyclizable compound has been introduced.

<VUV Irradiation>

Irradiation was carried while the irradiation time was adjusted using SUS740 manufactured by USHIO INC.

<Blade Coating>

Blade coating was carried out using Automatic film applicator 100-5 and a film applicator 064-13 having film thickness-adjustment function, manufactured by Allgood Co., Ltd.

<Formation of Polyparaxylylene (Parylene) Film>

A parylene dimer was put into PDS 2010 manufactured by Japan Parylene Limited Liability Company, and a film was formed by chemical vapor deposition.

<Evaluation of Lyophilic/Liquid-Repellent Patterning Performance>

To a washed and dried glass (substrate) (Eagle XG manufactured by Corning Inc.) having a size of 30×30 mm$^2$, a xylene solution of a resin (3 wt %) was spin-coated under the conditions of 500 rpm×5 seconds and 1500 rpm×20 seconds, and dried at 50° C. for one minute to form a planarization film which had been irradiated with ultraviolet ray and cross-linked. Thereafter, irradiation of vacuum ultraviolet ray (VUV) was carried out via a photomask having chromium patterns having line-and-space of 5 micron to 50 micron to pattern the surface of the planarization film into a lyophilic region and a hydrophobic region. This substrate was set to a main body of an automatic film applicator that had been heated to 70° C., Ag nanoink was dropped thereto, and then applied by moving a film applicator having a film thickness adjustment function at a speed of 140 mm/s and baked at 120° C. for 30 minutes. All the formed patterns were observed. A value of a pattern having the minimum line-and-space among patterns formed without defects was made to be a resolution.

Example 1

<Synthesis of Resin>

In a nitrogen box, in 300-mL Schlenk tube, 5.0 g of polystyrene having a weight-average molecular weight of 280,000 (hereinafter, referred to as a "raw material polymer A"), 150 mL of dehydrated methylene chloride, and 4.0 g of cinnamic acid chloride were charged and dissolved at room temperature under stirring. Into a 30-mL dropping funnel equipped with a 3-way cock at the upper part, and sealed at the lower part, 9.0 g of trifluoromethanesulfonic acid (hereinafter, referred to as "TFMS") was charged. The Schlenk tube and the dropping funnel mentioned above were taken out from the nitrogen box, and the Schlenk tube and the dropping funnel were linked to each other in a nitrogen sealed state. Flow of nitrogen to the Schlenk tube was stopped, and the 3-way cock in the upper part of the dropping funnel was linked to a calcium chloride tube, and the flow of nitrogen was stopped. Next, the Schlenk tube was cooled in ice water, and TFMS was dropped from the dropping funnel over 10 minutes. With dropping, the color of the polymer solution was changed to reddish purple. After completion of dropping, the ice water bath was removed, and reaction was performed at room temperature for 28 hours. The reaction solution was cooled in ice water again, and then a saturated aqueous solution dissolving 10.6 g of saturated sodium hydrogen carbonate was added to neutralize TFMS and hydrochloric acid in the system. The reacted product was transferred to a separation funnel and the methylene chloride layer was separated. Furthermore, a water layer was washed with methylene chloride three times, and separated to obtain a methylene chloride solution of a polymer. An operation of filtering the solution through 3-µm Teflon (registered trademark) filter, and precipitating again in 1.5 L of methanol, and isolating the polymer by filtration was carried out twice, followed by drying at 50° C. under reduced pressure to obtain 6.8 g of resin 1.

The results of analysis by $^1$H-NMR demonstrated that the obtained resin 1 (the following formula) included 59% by mole and 41% by mole of the structural units represented by the formulae (1) and (2), respectively.

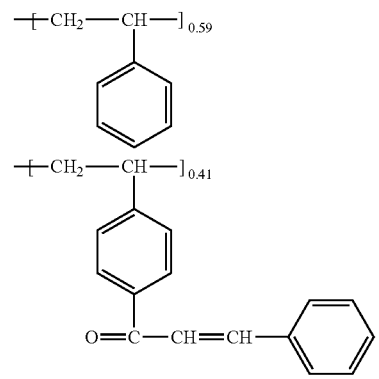

Figure 2:
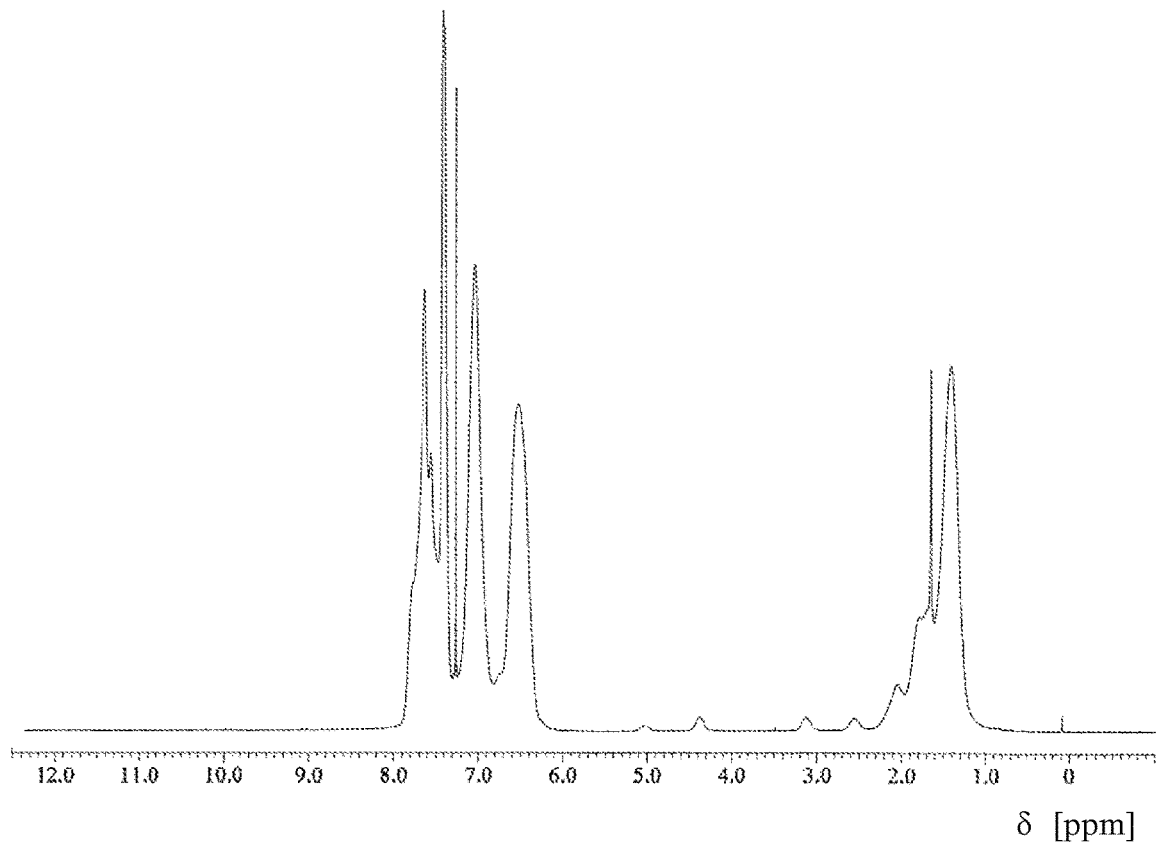
FIG. 2 is a graph showing a $^1$H-NMR chart of a resin 1 produced in Example 1.

Note here that the $^1$H-NMR of the resin 1 was shown in FIG. 2.

$^1$H-NMR (400 MHz, CDCl$_3$): δ7.62 (brs, —CH═CH-Ph), 7.39 to 6.51 (m, aromatic, —CH═CH-Ph), 2.04 (brs, —CH$_2$—CH—), 1.78 to 1.40 (bm, —CH$_2$—)

<Formation and Evaluation of FET Device>

To a washed and dried glass (substrate) (Eagle XG manufactured by Corning Inc.) having a size of 30×30 mm$^2$, aluminum was deposited so as to form a gate electrode having a thickness of 50 nm. The substrate on which an electrode was formed was spin-coated with a toluene solution of the obtained resin 1 (3 wt %) under the conditions of 500 rpm×5 seconds and 1000 rpm×20 seconds, and dried at 50° C. for 5 minutes (formation of an insulating film), then irradiated with 250 mJ/cm$^2$ of ultraviolet ray so as to form a cross-linked polymer dielectric layer having a film thickness of 520 nm. On the substrate on which a gate electrode and a polymer dielectric layer were formed, gold was deposited to form a source electrode and a drain electrode, having a thickness of 50 nm, a channel length of 100 µm and a channel width of 500 µm, were formed. Thereafter, immediately, the substrate was soaked in 30 mmol/L isopropanol solution of pentafluorobenzenethiol, taken out after 5 minutes had passed, washed with isopropanol, and blow-dried. Thereafter, 60 nL of 0.8 wt % toluene solution of an organic semiconductor (di-n-hexyldithienobenzodithiophene) printed by a dispenser. The solvent was volatilized and dried at 50° C. for one hour, and then a bottom-gate bottom-contact (BGBC) type organic field effect transistor device was prepared. Evaluation results of the prepared organic field effect transistor device are shown in Table 1.

TABLE 1

| | | Polymer dielectric layer | | | | | | | | | | | Organic field effect transistor (OFET) device performance | | | | | | |
|---|---|---|---|---|---|---|---|---|---|---|---|---|---|---|---|---|---|---|---|---|
| | | Dielectric layer | Film formation/drying | | Cross linking conditions | | | | | Surface roughness | Solvent wettability | Occurrence of crack | Threshold voltage [V] | Mobility [cm²/V·s] | On-current/off-current [-] | Hysteresis | Leakage current density [nA] | Breakdown voltage [MV/cm] |
| | Resin | thickness [nm] | Temperature [° C.] | Time [min] | Temperature [° C.] | Time [min] | Pressure [Pa] | UV irradiation amount [mJ/cm²] | | Ra [nm] | [Score] | | | | | | | |
| Example 1 | 1 | 520 | 50 | 5 | Room temperature | 1.0 | Normal pressure | 250 | | 0.2 | 5 | Absent | 1.2 | 0.36 | 10⁷ | Absent | 0.01 | 4.1 |
| 2 | 2 | 510 | 50 | 5 | Room temperature | 0.6 | Normal pressure | 150 | | 0.2 | 5 | Absent | 1.4 | 0.32 | 10⁷ | Absent | 0.01 | 4.1 |
| 3 | 3 | 510 | 50 | 5 | Room temperature | 0.9 | Normal pressure | 230 | | 0.2 | 5 | Absent | 1.1 | 0.35 | 10⁷ | Absent | 0.01 | 4.1 |
| 4 | 4 | 510 | 50 | 5 | Room temperature | 0.8 | Normal pressure | 200 | | 0.2 | 5 | Absent | 1.0 | 0.28 | 10⁷ | Absent | 0.01 | 4.1 |
| 5 | 5 | 510 | 50 | 5 | Room temperature | 1.0 | Normal pressure | 250 | | 0.2 | 5 | Absent | 1.4 | 0.30 | 10⁷ | Absent | 0.01 | 4.1 |
| 6 | 6 | 510 | 50 | 5 | Room temperature | 0.9 | Normal pressure | 230 | | 0.2 | 5 | Absent | 2.0 | 0.25 | 10⁷ | Absent | 0.01 | 4.1 |
| 7 | 7 | 520 | 50 | 5 | Room temperature | 0.8 | Normal pressure | 200 | | 0.2 | 5 | Absent | 1.5 | 0.32 | 10⁷ | Absent | 0.01 | 4.1 |
| 8 | 8 | 510 | 50 | 5 | Room temperature | 0.6 | Normal pressure | 160 | | 0.2 | 5 | Absent | 1.6 | 0.22 | 10⁷ | Absent | 0.01 | 4.1 |
| 9 | 9 | 430 | 50 | 5 | Room temperature | 0.4 | Normal pressure | 100 | | 0.2 | 5 | Absent | -7.7 | 0.3 | 10⁷ | Absent | 0.01 | 4.2 |
| 10 | 10 | 430 | 50 | 5 | Room temperature | 0.4 | Normal pressure | 100 | | 0.2 | 5 | Absent | -6.2 | 0.3 | 10⁷ | Absent | 0.01 | 4.2 |
| 11 | 11 | 430 | 50 | 5 | Room temperature | 0.4 | Normal pressure | 100 | | 0.2 | 5 | Absent | -7 | 0.3 | 10⁷ | Absent | 0.01 | 4.2 |
| 12 | 12 | 540 | 50 | 5 | Room temperature | 0.8 | Normal pressure | 200 | | 0.2 | 5 | Absent | 1.6 | 0.3 | 10⁷ | Absent | 0.01 | 4.2 |
| 13 | 13 | 430 | 50 | 5 | Room temperature | 0.4 | Normal pressure | 100 | | 0.3 | 5 | Absent | 1.2 | 0.36 | 10⁷ | Absent | 0.01 | 4.2 |
| Comparative Example 1 | 14 | 510 | 50 | 5 | Room temperature | 2.3 | Normal pressure | 600 | | 0.2 | 5 | Present | 1.5 | 0.23 | 10⁷ | Absent | 0.01 | 3.1 |
| 2 | 15 | 520 | 50 | 5 | Room temperature | 4.6 | Normal pressure | 1200 | | 03 | 5 | Present | 1 | 0.20 | 10⁷ | Absent | 0.01 | 3.1 |
| 3 | 16 | 520 | 50 | 5 | Room temperature | 3.1 | Normal pressure | 800 | | 0.3 | 5 | Present | 1.1 | 0.25 | 10⁷ | Absent | 0.01 | 3.1 |
| 4 | 17 | 520 | 50 | 5 | Room temperature | 4.2 | Normal pressure | 1100 | | 0.3 | 5 | Present | 1.1 | 0.30 | 10⁷ | Absent | 0.01 | 3.1 |
| 5 | 18 | 520 | 50 | 5 | Room temperature | 3.1 | Normal pressure | 800 | | 03 | 5 | Present | 1 | 0.30 | 10⁷ | Absent | 0.01 | 3.1 |
| 6 | 19 | 530 | 50 | 5 | Room temperature | 4.2 | Normal pressure | 1100 | | 0.3 | 5 | Present | 1.3 | 0.32 | 10⁷ | Absent | 0.01 | 3.1 |
| 7 | 20 | 520 | 50 | 5 | Room temperature | 3.1 | Normal pressure | 800 | | 0.3 | 5 | Present | 1.2 | 0.29 | 10⁷ | Absent | 0.01 | 3.1 |

TABLE 1-continued

| | | Polymer dielectric layer | | | | | | | | Organic field effect transistor (OFET) device performance | | | | | | |
|---|---|---|---|---|---|---|---|---|---|---|---|---|---|---|---|---|
| | | Dielectric layer thickness [nm] | Film formation/drying | | Cross linking conditions | | | UV irradiation amount [mJ/cm²] | Surface roughness Ra [nm] | Solvent wettability [Score] | Occurrence of crack | Threshold voltage [V] | Mobility [cm²/V·s] | On-current/off-current [-] | Hysteresis | Leakage current density [nA] | Breakdown voltage [MV/cm] |
| | Resin | | Temperature [°C] | Time [min] | Temperature [°C] | Time [min] | Pressure [Pa] | | | | | | | | | | |
| 8 | 21 | 530 | 50 | 5 | Room temperature | 4.6 | Normal pressure | 1200 | 0.3 | 5 | Present | 1.1 | 0.29 | 10⁷ | Absent | 0.01 | 3.1 |
| 9 | 22 | 530 | 50 | 5 | Room temperature | 3.1 | Normal pressure | 800 | 0.3 | 5 | Present | 1.1 | 0.29 | 10⁷ | Absent | 0.01 | 3.1 |

Figure 3:
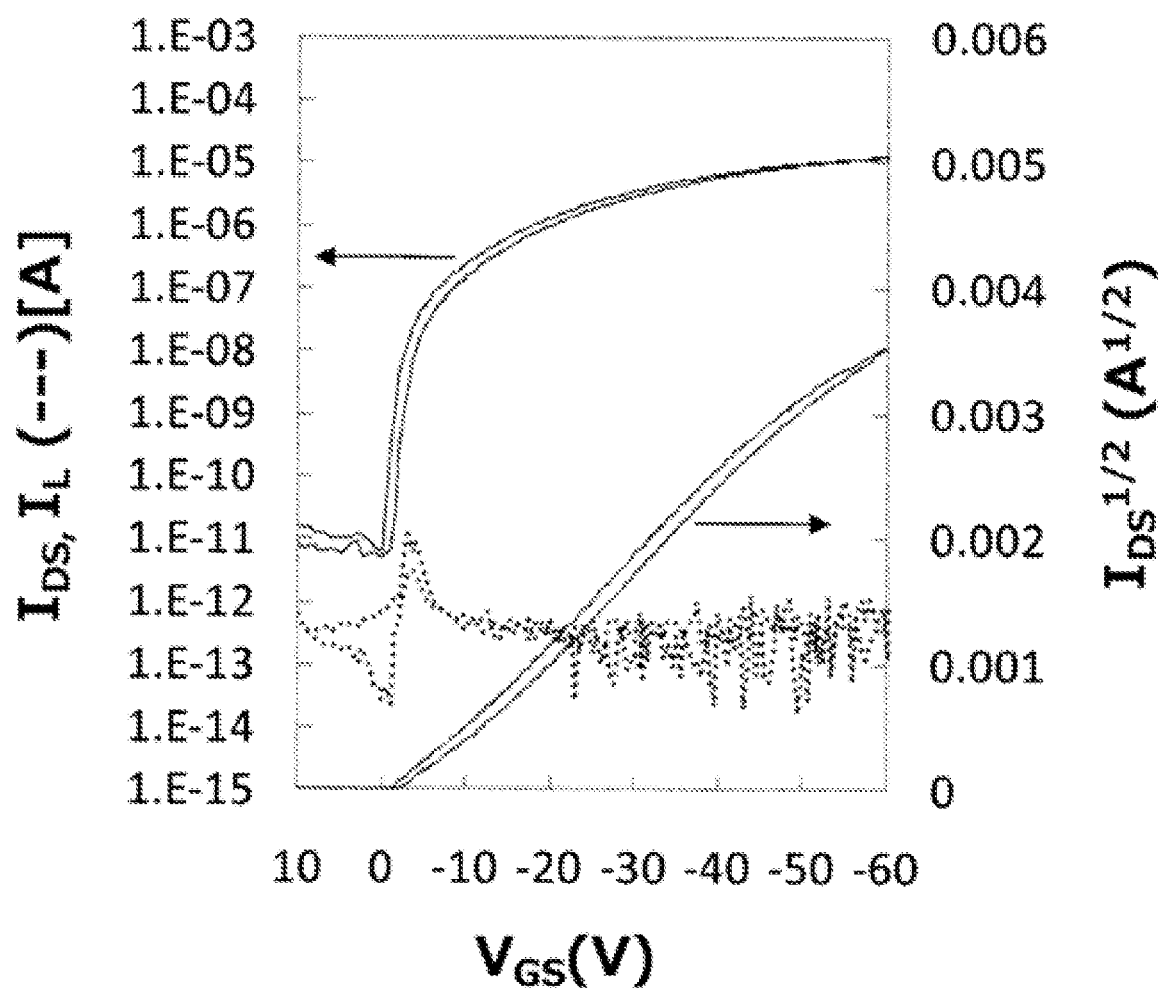
FIG. 3 is a graph showing that in an OFET device produced in Example 1, hysteresis is not observed in a source-drain current ($I_{SD}$) (solid line) observed when a gate voltage ($V_{GS}$) is changed, and that a leakage current value ($I_L$) (broken line) is very small as 0.01 nA or less.

The device was evaluated by setting a drain-source voltage $V_{DS}$ at −60 volts and varying a gate-source voltage. As a result, the mobility was 0.36 cm$^2$/V·s, the leakage current was 0.01 nA, no hysteresis was observed in a source-drain current, the on-current/off-current ratio was 10$^7$ or more, and the breakdown voltage was 4 MV/cm or more. Thus, the device was excellent in the leakage current, hysteresis, the on-current/off-current ratio, and breakdown voltage, and had no cracks in the organic semiconductor layer and insulating film. FIG. 3 shows that the hysteresis was not observed.

Example 2

In a nitrogen box, in 300-mL Schlenk tube, 10 g of raw material polymer A, 260 mL of dehydrated methylene chloride, and 19.2 g of cinnamic acid chloride were charged and dissolved at room temperature under stirring. Into a 100-mL dropping funnel equipped with a 3-way cock at the upper part, and sealed at the lower part, 26 g of TFMS was charged. The Schlenk tube and the dropping funnel mentioned above were taken out from the nitrogen box, and the Schlenk tube and the dropping funnel were linked to each other in a nitrogen sealed state. Flow of nitrogen to the Schlenk tube was stopped, and the 3-way cock in the upper part of the dropping funnel was linked to a calcium chloride tube, and the flow of nitrogen was stopped. Next, the Schlenk tube was cooled in ice water, and TFMS was dropped from the dropping funnel over 10 minutes. With dropping, the color of the polymer solution was changed to reddish purple. After completion of dropping, the ice water bath was removed, and reaction was performed at room temperature for 55 hours. The reaction solution was cooled in ice water again, and then a saturated aqueous solution dissolving 3.6 g of saturated sodium hydrogen carbonate was added to neutralize TFMS and hydrochloric acid in the system. The reacted product was transferred to a separation funnel and the methylene chloride layer was separated. Furthermore, a water layer was washed with methylene chloride three times, and separated to obtain a methylene chloride solution of a polymer. The solution was filtered through a 3-μm Teflon (registered trademark) filter. Subsequently, the filtrate was passed through a silica gel column to remove impurities, decolorized, and reprecipitated with 3 L of methanol. In addition, the polymer was reprecipitated and thereby purified, and dried at 50° C. under reduced pressure to obtain 18.2 g of resin 2.

The results of analysis by $^1$H-NMR demonstrated that the obtained resin 2 (the following formula) included 30% by mole and 70% by mole of the structural units represented by the formulae (1) and (2), respectively.

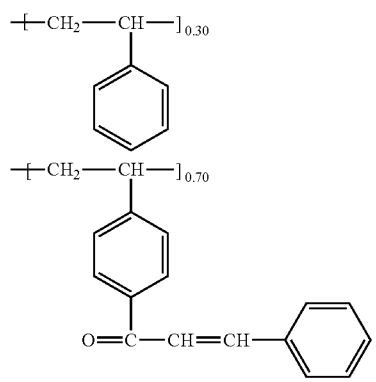

$^1$H-NMR (400 MHz, CDCl$_3$): δ7.62 (brs, —CH=CH-Ph), 7.39 to 6.51 (m, aromatic, —CH=CH-Ph), 2.04 (brs, —CH$_2$—CH—), 1.78 to 1.40 (bm, —CH$_2$—)

An insulating film was formed using the resin 2 produced in Example 2 in the same manner as in Example 1, the organic field effect transistor device was prepared. Evaluation results etc. of the prepared organic field effect transistor device are also shown in Table 1.

As in Example 1, excellent performance as the organic field effect transistor device was demonstrated.

Example 3

A resin 3 was obtained in the same manner as in Example 1 except that cinnamic acid chloride was changed to coumarin-6-carboxylate chloride.

The results of analysis by $^1$H-NMR demonstrated that the obtained resin 3 (the following formula) included 75% by mole and 25% by mole of the structural units represented by the formulae (1) and (2), respectively.

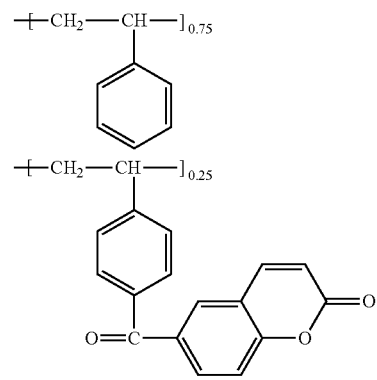

$^1$H-NMR (400 MHz, CDCl$_3$): δ7.82 (brs, —CH=CH—C(O)—), 7.70 to 6.60 (m, aromatic, —CH=CH-Ph), 2.15 (brs, —CH$_2$—CH—), 1.90 to 1.48 (bm, —CH$_2$—)

An insulating film was formed using the obtained resin 3 in the same manner as in Example 1, and then, the organic field effect transistor device was prepared. Evaluation results etc. of the prepared organic field effect transistor device are also shown in Table 1.

As in Example 1, excellent performance as the organic field effect transistor device was demonstrated.

Example 4

A resin 4 was obtained in the same manner as in Example 1 except that cinnamic acid chloride was changed to coumarin-6-carboxylate chloride.

The results of analysis by $^1$H-NMR demonstrated that the obtained resin 4 (the following formula) included 60% by mole and 40% by mole of the structural units represented by the formulae (1) and (2), respectively.

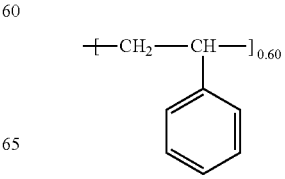

-continued

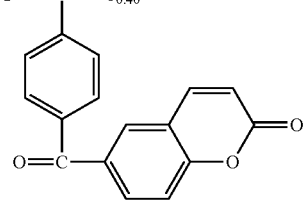

$^1$H-NMR (400 MHz, CDCl$_3$): δ7.82 (brs, —CH=CH—C(O)—), 7.70 to 6.60 (m, aromatic, —CH=CH-Ph), 2.15 (brs, —CH$_2$—CH—), 1.90 to 1.48 (bm, —CH$_2$—)

An insulating film was formed using the obtained resin 4 in the same manner as in Example 1, the organic field effect transistor device was prepared. Evaluation results etc. of the prepared organic field effect transistor device are also shown in Table 1.

As in Example 1, excellent performance as the organic field effect transistor device was demonstrated.

Example 5

A resin 5 was obtained in the same manner as in Example 1 except that cinnamic acid chloride was changed to pyridinylethenyl benzoic acid chloride.

The results of analysis by $^1$H-NMR demonstrated that the obtained resin 5 (the following formula) included 72% by mole and 28% by mole of the structural units represented by the formulae (1) and (2), respectively.

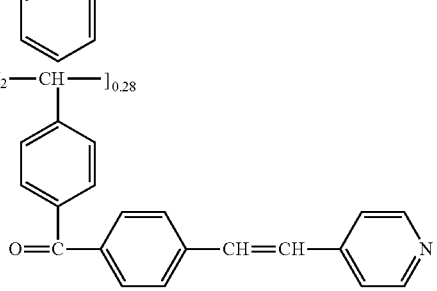

$^1$H-NMR (400 MHz, CDCl$_3$): δ7.80 (brs, Py—CH=CH—), 7.76 to 6.60 (m, aromatic, —CH=CH-Ph), 2.15 (brs, —CH$_2$—CH—), 1.90 to 1.48 (bm, —CH$_2$—)

An insulating film was formed using the obtained resin 5 in the same manner as in Example 1, the organic field effect transistor device was prepared. Evaluation results etc. of the prepared organic field effect transistor device are also shown in Table 1.

As in Example 1, excellent performance as the organic field effect transistor device was demonstrated.

Example 6

A resin 6 was obtained in the same manner as in Example 1 except that cinnamic acid chloride was changed to pyridinylethenyl benzoic acid chloride.

The results of analysis by $^1$H-NMR demonstrated that the obtained resin 6 (the following formula) included 58% by mole and 42% by mole of the structural units represented by the formulae (1) and (2), respectively.

—[CH$_2$—CH—]$_{0.58}$

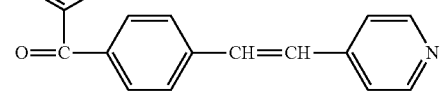

—[CH$_2$—CH—]$_{0.42}$ $^1$H-NMR (400 MHz, CDCl$_3$): δ7.80 (brs, Py—CH=CH—), 7.76 to 6.60 (m, aromatic, —CH=CH-Ph), 2.15 (brs, —CH$_2$—CH—), 1.90 to 1.48 (bm, —CH$_2$—)

An insulating film was formed using the obtained resin 6 in the same manner as in Example 1, the organic field effect transistor device was prepared. Evaluation results etc. of the prepared organic field effect transistor device are also shown in Table 1.

As in Example 1, excellent performance as the organic field effect transistor device was demonstrated.

Example 7

A resin 7 was obtained in the same manner as in Example 1 except that cinnamic acid chloride was changed to phenylethenyl benzoic acid chloride.

The results of analysis by $^1$H-NMR demonstrated that the obtained resin 7 (the following formula) included 60% by mole and 40 by mole of the structural units represented by the formulae (1) and (2), respectively.

—[CH$_2$—CH—]$_{0.60}$

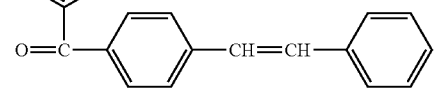

—[CH$_2$—CH—]$_{0.40}$ $^1$H-NMR (400 MHz, CDCl$_3$): δ7.67 (brs, —CH=CH—), 7.10 to 6.32 (m, aromatic, —CH=CH—), 2.15 (brs, —CH$_2$—CH—), 1.90 to 1.48 (bm, —CH$_2$—)

An insulating film was formed using the obtained resin 7 in the same manner as in Example 1, the organic field effect transistor device was prepared. Evaluation results etc. of the prepared organic field effect transistor device are also shown in Table 1.

As in Example 1, excellent performance as the organic field effect transistor device was demonstrated.

Example 8

A resin 8 was obtained in the same manner as in Example 1 except that cinnamic acid chloride was changed to phenylethenyl benzoic acid chloride.

The results of analysis by $^1$H-NMR demonstrated that the obtained resin 8 (the following formula) included 40% by mole and 60% by mole of the structural units represented by the formulae (1) and (2), respectively.

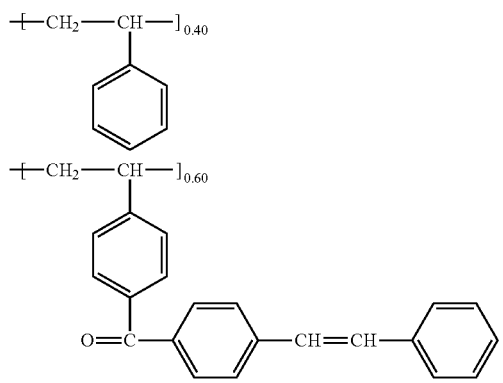

$^1$H-NMR (400 MHz, CDCl$_3$): δ7.67 (brs, —CH═CH—), 7.10 to 6.32 (m, aromatic, —CH═CH—), 2.15 (brs, —CH$_2$—CH—), 1.90 to 1.48 (bm, —CH$_2$—)

An insulating film was formed using the obtained resin 8 in the same manner as in Example 1, the organic field effect transistor device was prepared. Evaluation results etc. of the prepared organic field effect transistor device are also shown in Table 1.

As in Example 1, excellent performance as the organic field effect transistor device was demonstrated.

Example 9

In a nitrogen box, in 300-mL Schlenk tube, 4.01 g of polystyrene-b-poly(ethylene/propylene)-b-polystyrene (SEPS) having a weight-average molecular weight of 150,000 and polystyrene content of 65 wt % (hereinafter, referred to as "raw material polymer B"), 150 mL of dehydrated methylene chloride, and 4.5 g of cinnamic acid chloride were charged and dissolved at room temperature under stirring. Next, the Schlenk tube was cooled to 0° C. or less, and 6.2 g of TFMS was dropped using a syringe. With dropping, the color of the polymer solution was changed to reddish purple. After completion of dropping, the ice water bath was removed, and reaction was performed at room temperature for 24 hours. The reaction solution was cooled in ice water again, and then a saturated aqueous solution dissolving 6.9 g of saturated sodium hydrogen carbonate was added to neutralize TFMS and hydrochloric acid in the system. The reacted product was transferred to a separation funnel and the methylene chloride layer was separated. Furthermore, a water layer was washed with methylene chloride three times, and separated to obtain a methylene chloride solution of a polymer. The solution was filtered through 3-μm Teflon (registered trademark) filter. Subsequently, the filtrate was passed through a silica gel column to remove impurities, decolorized, and reprecipitated with 1.5 L of methanol. In addition, the polymer was reprecipitated and thereby purified twice, and dried at 40° C. under reduced pressure to obtain 5.6 g of resin 9.

The results of analysis by $^1$H-NMR demonstrated that the obtained resin 9 (the following formula) included 27% by mole and 29% by mole of the structural units represented by the formulae (1) and (2), respectively.

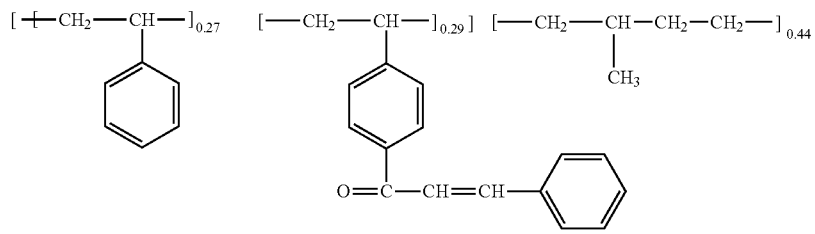

$^1$H-NMR (400 MHz, CDCl$_3$): δ7.59 (brs, —CH═CH-Ph), 7.36 (brs, aromatic),6.99 (brs, aromatic), 6.45 (brs, —CH═CH-Ph), 1.90 to 1.00 (bm, —CH$_2$—), 0.84 (bm, —CH$_3$)

<Evaluation of Lyophilic/Liquid-Repellent Patterning Performance>

Excellent drawings were made in all line-and-space patterns of 5 to 50 micron, it was observed that the resolution was 5 micron. Furthermore, the surface roughness of the obtained film was 0.3 nm, and excellent planarity was exhibited.

<Formation and Evaluation of Organic TFT Device>

Figure 4:
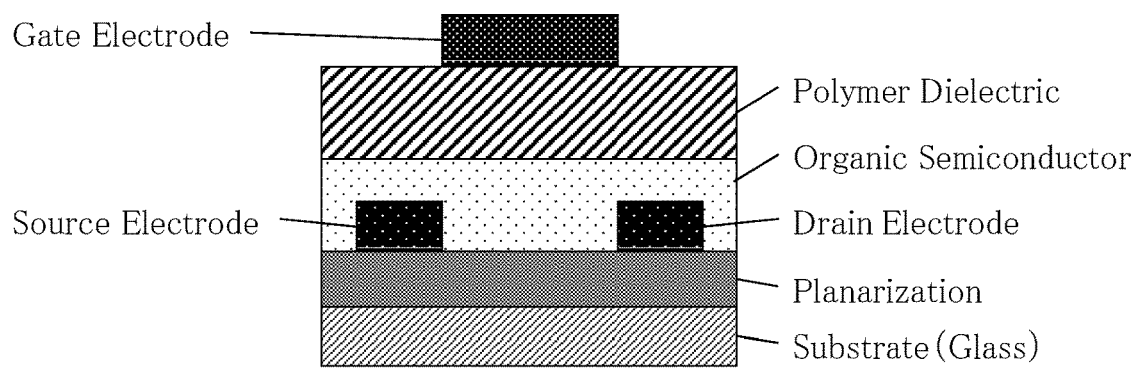
FIG. 4 is a view showing a cross-sectional shape of a top-gate bottom-contact (TGBC) type device.
Figure 5:
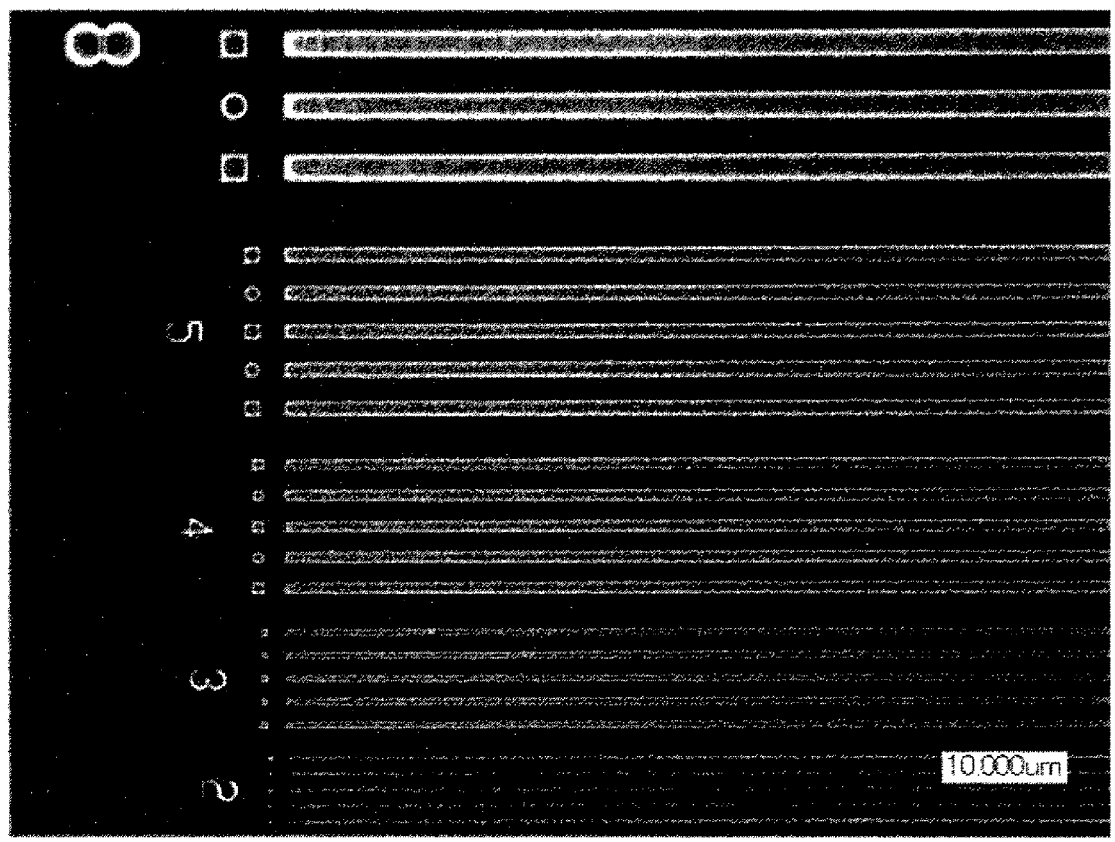
FIG. 5 is a view showing a test pattern of Ag wiring formed by lyophilic/liquid-repellent patterning in Example 9.

To a washed and dried glass (substrate) (Eagle XG manufactured by Corning Inc.) having a size of 30×30 mm$^2$, a xylene solution of the obtained resin 9 (3 wt %) was spin-coated under the conditions of 500 rpm×5 seconds and 1500 rpm×20 seconds, and dried at 50° C. for 5 minutes and irradiated with 100 mJ/cm$^2$ ultraviolet ray to form an underlayer having a film thickness of 100 nm and cross-linked. Thereafter, irradiation of VUV was carried out via a photomask for 180 seconds to pattern the surface of the underlayer to have lyophilicity and liquid-repellency. The substrate was set to a main body of an automatic film applicator which had been heated to 70° C., Ag nanoink was dropped thereto, and applied by moving a film applicator having a film thickness adjustment function at a speed of 140 mm/s, and then baked at 120° C. for 30 minutes to form a source electrode and a drain electrode having a thickness of 500 nm, a channel length of 5 μm, a channel width of 500 μm, and an electrode width of 100 μm. Then, immediately, the substrate was soaked in an isopropanol solution of 30 mmol/L pentafluorobenzenethiol, taken out at the time 5 minutes had passed, washed with isopropanol, and blow-dried. Thereafter, 0.8 wt % xylene/tetralin mixture solution of an organic semiconductor (di-n-hexyl dithienobenzothiophene) was spin-coated so as to form a film. In order to volatilize a solvent, drying was carried out at 90° C. for 20 minutes. Thereafter, the obtained substrate and 0.6 g of a Parylene dimer were put into a vacuum evaporator, and heated in a vacuum to vaporize the Parylene dimer to polymerize on the substrate to form a gate insulating layer having a thickness of 430 nm and made of polyparaxylylene. Thereafter, irradiation with VUV was carried out via a photomask for 180 seconds to pattern the surface of the insulating film to have lyophilicity and hydrophobicity. The substrate was set to a main body of an automatic film applicator which had been heated to 70° C., Ag nanoink was dropped, applied at a speed of 140 mm/s, baked at 90° C. for 20 minutes to form a gate electrode having a thickness of 500 nm to prepare a top-gate bottom-contact (TGBC) type organic field effect transistor device. A configuration of the prepared organic field effect transistor is shown in FIG. 4, and evaluation results are shown in Table 1.

The device was evaluated by setting a drain-source voltage VDS at −60 volts and varying a gate-source voltage. As a result, the mobility was 0.3 cm$^2$/V·s, the leakage current was 0.01 nA, no hysteresis was observed in a source-drain current, the on-current/off-current ratio was 10$^7$ or more, and the breakdown voltage was 4 MV/cm or more. The device was excellent in the leakage current, hysteresis, on-current/off-current ratio, and breakdown voltage, and had no cracks in the organic semiconductor layer and the under-layer.

Example 10

In a nitrogen box, in 300-mL Schlenk tube, 4.01 g of raw material polymer B, 150 mL of dehydrated methylene chloride, and 5.99 g of cinnamic acid chloride were charged and dissolved at room temperature under stirring. Next, the Schlenk tube was cooled to 0° C. or less, and 8.2 g of TFMS was dropped using a syringe. With dropping, the color of the polymer solution was changed to reddish purple. After completion of dropping, the ice water bath was removed, and reaction was performed at room temperature for 25 hours. The reaction solution was cooled in ice water again, and then a saturated aqueous solution dissolving 9.14 g of saturated sodium hydrogen carbonate was added to neutralize TFMS and hydrochloric acid in the system. The reacted product was transferred to a separation funnel and the methylene chloride layer was separated. In addition, a water layer was washed with methylene chloride three times, and separated to obtain a methylene chloride solution of a polymer. The solution was filtered through 3-μm Teflon (registered trademark) filter. Subsequently, the filtrate was passed through a silica gel column to remove impurities, decolorized, and reprecipitated with 1.5 L of methanol. In addition, the polymer was reprecipitated and thereby purified, and dried at 40° C. under reduced pressure to obtain 6.0 g of resin 10.

The results of analysis by $^1$H-NMR demonstrated that the obtained resin 10 (the following formula) included 21% by mole and 32% by mole of the structural units represented by the formulae (1) and (2), respectively.

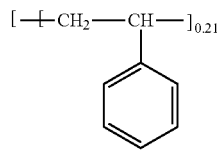
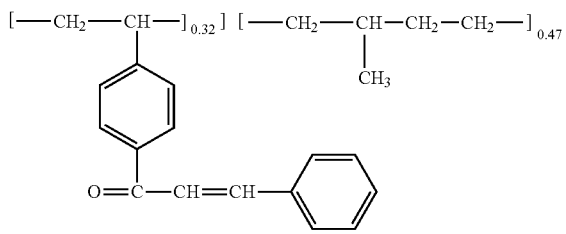

$^1$H-NMR (400 MHz, CDCl$_3$): δ7.59 (brs, —CH=CH-Ph), 7.36 (brs, aromatic), 6.99 (brs, aromatic), 6.45 (brs, —CH=CH-Ph), 1.90 to 1.00 (bm, —CH$_2$—), 0.84 (bm, —CH$_3$)

<Evaluation of Lyophilic/Liquid-Repellent Patterning Performance>

Evaluation was carried out in the same manner as in Example 9. It was demonstrated that excellent drawings are made in all line-and-space pattern of 5 to 50 micron, and resolution of 5 micron. The surface roughness of the obtained film was 0.3 nm, thus exhibiting excellent planarity.

<Formation and Evaluation of Organic TFT Device>

A top-gate bottom-contact (TGBC) type organic field effect transistor device was prepared in the same manner as in Example 9. Evaluation results of the prepared organic field effect transistor are also shown in Table 1.

As in Example 9, excellent performance as the organic field effect transistor device was observed.

Example 11

In a nitrogen box, in 300-mL Schlenk tube, 3.0 g of raw material polymer B, 150 mL of dehydrated methylene chloride, and 6.3 g of cinnamic acid chloride were charged and dissolved at room temperature under stirring. Next, the Schlenk tube was cooled to 0° C. or less, and 8.44 g of TFMS was dropped using a syringe. With dropping, the color of the polymer solution was changed to reddish purple. After completion of dropping, the ice water bath was removed, and reaction was performed at room temperature for 29 hours. The reaction solution was cooled in ice water again, and then a saturated aqueous solution dissolving 9.45 g of saturated sodium hydrogen carbonate was added to neutralize TFMS and hydrochloric acid in the system. The reacted product was transferred to a separation funnel and the methylene chloride layer was separated. Furthermore, a water layer was washed with methylene chloride three times, and separated to obtain a methylene chloride solution of a polymer. The solution was filtered through 3-μm Teflon (registered trademark) filter. Subsequently, the filtrate was passed through a silica gel column to remove impurities, decolorized, and reprecipitated with 1.5 L of methanol. In addition, the polymer was reprecipitated and thereby purified, and dried at 40° C. under reduced pressure to obtain 4.9 g of resin 11.

The results of analysis by ¹H-NMR demonstrated that the obtained resin 11 (the following formula) included 17% by mole and 39% by mole of the structural units represented by the formulae (1) and (2), respectively.

The remaining saturated sodium hydrogen carbonate solution was put into a 1-L beaker, and cooled by adding 100 g of ice thereto. To the beaker, a reaction solution was poured, and the reaction solution was stirred for 2 hours, and then transferred to a separation funnel to separate a methylene chloride layer. In addition, a water layer was washed with methylene chloride three times, separated to obtain a methylene chloride solution of a polymer. An operation of reprecipitating this polymer solution with 3 L of methanol

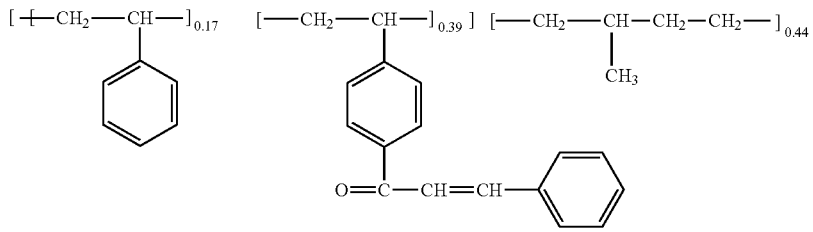

¹H-NMR (400 MHz, CDCl₃): δ7.59 (brs, —CH═CH-Ph), 7.36 (brs, aromatic), 6.99 (brs, aromatic), 6.45 (brs, —CH═CH-Ph), 1.90 to 1.00 (bm, —CH₂—), 0.84 (bm, —CH₃)

<Evaluation of Lyophilic/Liquid-Repellent Patterning Performance>

Evaluation was carried out in the same manner as in Example 9. It was demonstrated that excellent drawings are made in all line-and-space pattern of 5 to 50 micron, and resolution of 5 micron. The surface roughness of the obtained film was 0.3 nm, thus exhibiting excellent planarity.

<Formation and Evaluation of Organic TFT Device>

A top-gate bottom-contact (TGBC) type organic field effect transistor device was prepared in the same manner as in Example 9. Evaluation results of the prepared organic field effect transistor are also shown in Table 1.

As in Example 9, excellent performance as the organic field effect transistor device was observed.

Example 12

In a nitrogen box, in 300-mL Schlenk tube, 10 g of the raw material polymer A, 260 mL of dehydrated methylene chloride, and 19.2 g of cinnamic acid chloride were charged and dissolved at room temperature under stirring. Into a 100-mL dropping funnel equipped with a 3-way cock at the upper part and sealed at the lower part, 26 g of TFMS was charged. The Schlenk tube and the dropping funnel mentioned above were taken out from the nitrogen box, and the Schlenk tube and the dropping funnel were linked to each other in a nitrogen sealed state. Flow of nitrogen to the Schlenk tube was stopped, and the 3-way cock in the upper part of the dropping funnel was linked to a calcium chloride tube, and the flow of nitrogen was stopped. Next, the Schlenk tube was cooled in a low-temperature incubator, and TFMS was dropped from the dropping funnel over 10 minutes under stirring with a magnetic stirrer. With dropping, the color of the polymer solution was changed to reddish purple. After completion of dropping, reaction was performed at 1° C. for 55 hours. From 360 mL of a saturated aqueous solution dissolving 36 g of saturated sodium hydrogen carbonate, 100 mL of the solution was dropped slowly.

was carried out twice, and then the obtained solution was filtered and dried at 50° C. under reduced pressure to obtain 17.9 g of resin 12.

The results of analysis by ¹H-NMR demonstrated that the obtained resin 12 (the following formula) included 36.5% by mole, 62.5% by mole, and 1.0% by mole of the structural units represented by the formulae (1), (2), and (18), respectively.

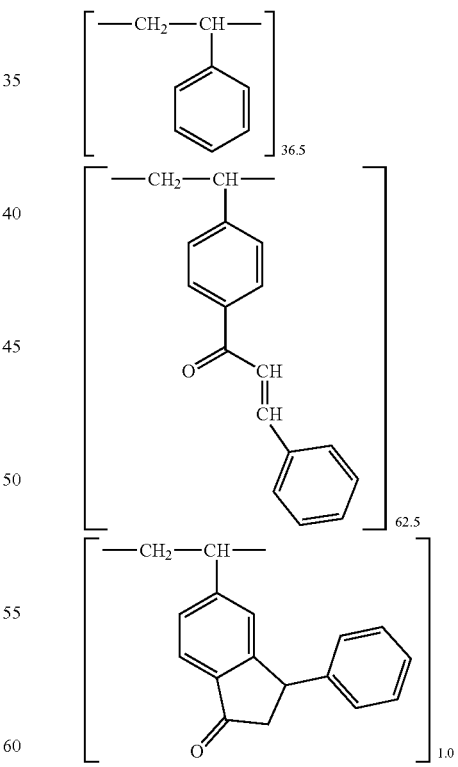

¹H-NMR (400 MHz, CDCl₃): δ7.62 (brs, —CH═CH-Ph), 7.39 to 6.51 (m, aromatic, —CH═CH-Ph), δ4.5 (brs, —C(O)CH₂—CH(Ph)—), δ2.57 (brs, —C(O)CH₂—CH (Ph)—), δ3.14 (brs, —C(O)CH₂—CH(Ph)—), 2.04 (brs, —CH₂—CH—),1.78 to 1.40 (bm, —CH₂—)

An insulating film was formed using the obtained resin 12 in the same manner as in Example 1, the organic field effect transistor device was prepared. Evaluation results etc. of the prepared organic field effect transistor device are also shown in Table 1.

As in Example 1, excellent performance as the organic field effect transistor device was demonstrated.

Example 13

In a nitrogen box, in a 300-mL Schlenk tube, 1.1 g of the raw material polymer B, 30 mL of dehydrated methylene chloride, and 1.3 g of 3-(perfluorohexyl)propionyl chloride were charged and dissolved at room temperature under stirring. Next, the Schlenk tube was cooled in ice water, and 1.2 g of TFMS was dropped using a syringe under the flow of nitrogen. With dropping, the color of the polymer solution was changed to reddish purple. After completion of dropping, the ice water bath was removed, and reaction was performed at room temperature for 48 hours. The reaction solution was cooled in ice water again, and then an aqueous solution dissolving 1.2 g of sodium hydrogen carbonate was dropped so as to neutralize TFMS and hydrochloric acid in the system. The reacted solution was transferred to a separation funnel, and the water phase was separated. Furthermore, a methylene chloride phase was washed with water three times, and separated to obtain a methylene chloride solution of a polymer. The solution was reprecipitated in 300 mL of methanol. In addition, the polymer was reprecipitated and thereby purified twice, and dried at 40° C. under reduced pressure to obtain 1.7 g of resin 13-a (the following formula).

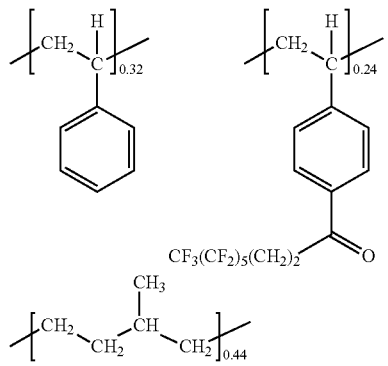

In addition, in a nitrogen box, 100-mL Schlenk tube was charged with 1.0 g of the obtained resin 13-a, 40 mL of dehydrated methylene chloride, and 0.59 g of cinnamic acid chloride were charged, and dissolved at room temperature under stirring. Next, the Schlenk tube was cooled in ice water, and 1.3 g of TFMS was dropped using a syringe under the flow of nitrogen. With dropping, the color of the polymer solution was changed to reddish purple. After completion of dropping, the ice water bath was removed, and reaction was performed at room temperature for 48 hours. The reaction solution was cooled in ice water again, and then an aqueous solution dissolving 1.2 g of sodium hydrogen carbonate was dropped so as to neutralize TFMS and hydrochloric acid in the system. The reacted solution was transferred to a separation funnel, and the water phase was separated. Furthermore, a methylene chloride phase was washed with water three times, and separated to obtain a methylene chloride solution of a polymer. The solution was reprecipitated in 350 mL of methanol. In addition, the polymer was reprecipitated and thereby purified twice, and dried at 40° C. under reduced pressure to obtain 1.1 g of resin 13.

The results of analysis by $^1$H-NMR demonstrated that the obtained resin 1 (the following formula) included 3% by mole, 29% by mole, and 24% by mole of the structural units represented by the formulae (1), (2), and (19), respectively.

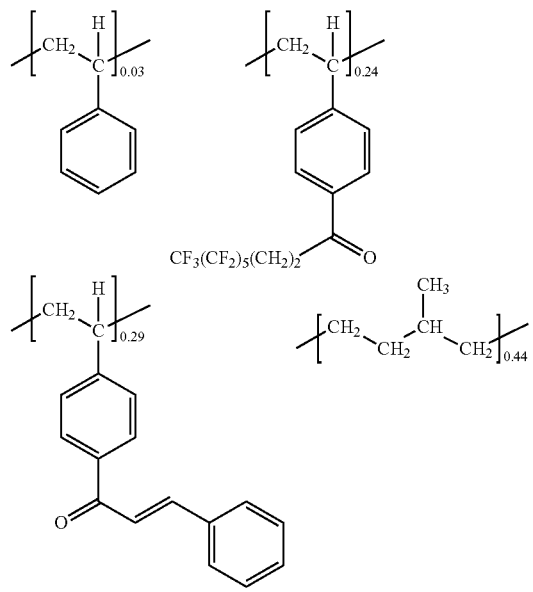

$^1$H-NMR (400 MHz, CDCl$_3$): δ7.62 (brs, aromatic, —CH═CH-Ph), 7.39 to 6.51 (m, aromatic, —CH═CH-Ph), 3.12 (brs, —CH$_2$—C(═O)—), 2.52 (brs, —CF$_2$—CH$_2$—), 1.90 to 1.00 (bm, —CH$_2$—), 0.84 (bm, —CH$_3$)

An insulating film was formed using the obtained resin 13 in the same manner as in Example 1, the organic field effect transistor device was prepared. Evaluation results etc. of the prepared organic field effect transistor device are also shown in Table 1.

As in Example 1, excellent performance as the organic field effect transistor device was demonstrated.

<Evaluation of Lyophilic/Liquid-Repellent Patterning Performance>

Evaluation was carried out in the same manner as in Example 9. It was demonstrated that excellent drawings are made in all line-and-space pattern of 5 to 50 micron, and resolution of 5 micron. The surface roughness of the obtained film was 0.3 nm, thus exhibiting excellent planarity.

Comparative Example 1

In a nitrogen box, in a 300-mL Schlenk tube, 5.0 g of raw material polymer A, 150 mL of dehydrated methylene chloride, and 3.9 g of anhydrous aluminum chloride were charged and dissolved at room temperature under stirring. Into a 300-mL dropping funnel equipped with a 3-way cock at the upper part and sealed at the lower part, 30 mL of methylene chloride solution of 4.0 g of cinnamic acid chloride was charged. The Schlenk tube and the dropping funnel mentioned above were taken out from the nitrogen box, and the Schlenk tube and the dropping funnel were linked to each other in a nitrogen sealed state. Flow of nitrogen to the Schlenk tube was stopped, and the 3-way cock in the upper part of the dropping funnel was linked to a calcium chloride tube, and the flow of nitrogen was stopped. Next, the Schlenk tube was cooled in ice water, and cinnamic acid chloride was dropped from the dropping funnel over 10 minutes. With dropping, the color of the polymer solution was changed to reddish purple. After completion of dropping, the ice water bath was removed, and reaction was performed at room temperature for 28 hours. The reaction solution was cooled in ice water again, and then 20 mL of 35% hydrochloric acid aqueous solution was dropped. Stirring was carried out in this state for 5 hours, and then the reaction solution was transferred to a separation funnel to separate a methylene chloride layer. The methylene chloride layer was washed with water four times repeatedly. The water layer was extracted with methylene chloride three times, and separated. An operation of combining the obtained methylene chloride layer thereto, filtering the resultant through 3-μm Teflon (registered trademark) filter to reprecipitate 1.5 L of methanol, and isolating the polymer by filtration was carried out twice, followed by drying at 50° C. under reduced pressure to obtain 5.9 g of resin 14.

The results of analysis by $^1$H-NMR demonstrated that the obtained resin 14 (the following formula) included 86% by mole and 14% by mole of the structural units represented by the formulae (1) and (2), respectively.

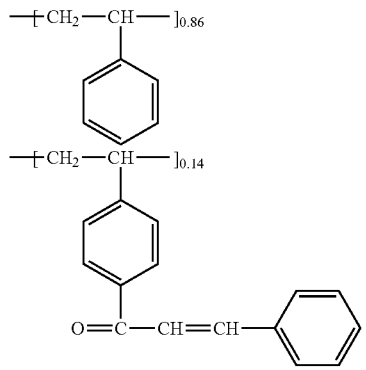

$^1$H-NMR (400 MHz, CDCl$_3$): δ7.62 (brs, —CH=CH-Ph),7.39 to 6.51 (m, aromatic, —CH=CH-Ph), 2.04 (brs, —CH$_2$—CH—), 1.78 to 1.40 (bm, —CH$_2$—)

The organic field effect transistor device was prepared using the obtained resin in the same manner as in Example 1. Evaluation results etc. of the prepared organic field effect transistor device are also shown in Table 1.

It was demonstrated that cross-linking time, solvent resistance (cracking resistance), and breakdown voltage were inferior to those in Examples 1 to 8.

Comparative Example 2

In a nitrogen box, a 300-mL Schlenk tube was charged with 5.0 g of raw material polymer A, 150 mL of dehydrated methylene chloride, and 1.2 g of anhydrous aluminum chloride. A 30-mL dropping funnel, equipped with a 3-way cock at the upper part, and sealed at the lower part, was charged with a solution in which 1.3 g of cinnamic acid chloride was dissolved in 20 mL of methylene chloride solution. The Schlenk tube and the dropping funnel mentioned above were taken out from the nitrogen box, and the Schlenk tube and the dropping funnel were linked to each other in a nitrogen sealed state. Flow of nitrogen to the Schlenk tube was stopped, and the 3-way cock in the upper part of the dropping funnel was linked to a calcium chloride tube, and the flow of nitrogen was stopped. Next, the Schlenk tube was cooled in ice water, and cinnamic acid chloride was dropped from the dropping funnel over 10 minutes. With dropping, the color of the polymer solution was changed to reddish purple. After completion of dropping, the ice water bath was removed, and reaction was performed at room temperature for 28 hours. The reaction solution was cooled in ice water again, and then a saturated aqueous solution dissolving 2.1 g of saturated sodium hydrogen carbonate was added to neutralize hydrochloric acid in the system. The reacted product was transferred to a separation funnel, and a methylene chloride layer was separated. In addition, a water layer was washed with methylene chloride three times, and separated to obtain a methylene chloride solution of the polymer. An operation of filtering the solution through 3-μm Teflon (registered trademark) filter, and precipitating again in 1.5 L of methanol, and isolating the polymer by filtration was carried out twice, followed by drying at 50° C. under reduced pressure to obtain 4.7 g of resin 15.

The results of analysis by $^1$H-NMR demonstrated that the obtained resin 15 (the following formula) included 92% by mole and 8% by mole of the structural units represented by the formulae (1) and (2), respectively.

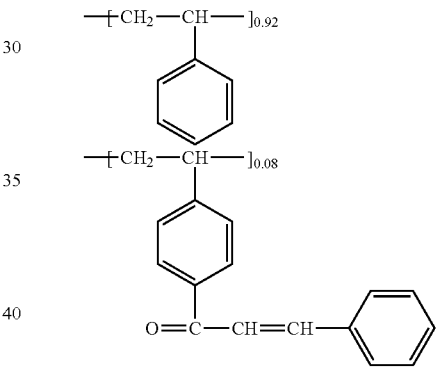

$^1$H-NMR (400 MHz, CDCl$_3$): δ7.62 (brs, —CH=CH-Ph),7.39 to 6.51 (m, aromatic, —CH=CH-Ph), 2.04 (brs, —CH$_2$—CH—), 1.78 to 1.40 (bm, —CH$_2$—)

The organic field effect transistor device was prepared using the obtained resin in the same manner as in Example 1. Evaluation results etc. of the prepared organic field effect transistor device are also shown in Table 1.

It was demonstrated that cross-linking time, solvent resistance (cracking resistance), and breakdown voltage were inferior to those in Examples 1 to 8.

Comparative Example 3

In a nitrogen box, a 300-mL Schlenk tube was charged with 5 g of raw material polymer A, 150 mL of dehydrated methylene chloride, and 2.2 g of anhydrous aluminum chloride. A 20-mL dropping funnel, equipped with a 3-way cock at the upper part, and sealed at the lower part, was charged with a solution in which 2.3 g of cinnamic acid chloride was dissolved in 50 mL of methylene chloride solution. The Schlenk tube and the dropping funnel mentioned above were taken out from the nitrogen box, and the Schlenk tube and the dropping funnel were linked to each other in a nitrogen sealed state. Flow of nitrogen to the Schlenk tube was stopped, and the 3-way cock in the upper part of the dropping funnel was linked to a calcium chloride tube, and the flow of nitrogen was stopped. Next, the Schlenk tube was cooled in ice water, and cinnamic acid chloride was dropped from the dropping funnel over 9 minutes. With dropping, the color of the polymer solution was changed to reddish purple. After completion of dropping, the ice water bath was removed, and reaction was performed at room temperature for 28 hours. The reaction solution was cooled in ice water again, and then a saturated aqueous solution dissolving 3.9 g of saturated sodium hydrogen carbonate was added to neutralize hydrochloric acid in the system. The reacted product was transferred to a separation funnel, and a methylene chloride layer was separated. In addition, a water layer was washed with methylene chloride three times, and separated to obtain a methylene chloride solution of the polymer. An operation of filtering the solution through 3-μm Teflon (registered trademark) filter, and precipitating again in 1.5 L of methanol, and isolating the polymer by filtration was carried out twice, followed by drying at 50° C. under reduced pressure to obtain 4.9 g of resin 16.

The results of analysis by $^1$H-NMR demonstrated that the obtained resin 16 (the following formula) included 87% by mole and 13% by mole of the structural units represented by the formulae (1) and (2), respectively.

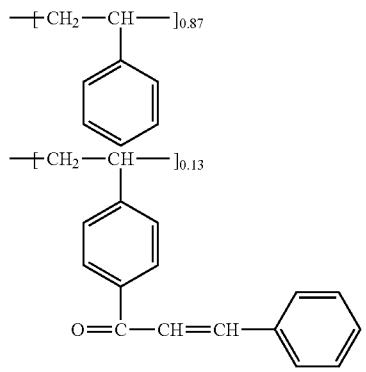

$^1$H-NMR (400 MHz, CDCl$_3$): δ7.62 (brs, —CH═CH-Ph),7.39 to 6.51 (m, aromatic, —CH═CH-Ph), 2.04 (brs, —CH$_2$—CH—), 1.78 to 1.40 (bm, —CH$_2$—)

The organic field effect transistor device was prepared using the obtained resin in the same manner as in Example 1. Evaluation results etc. of the prepared organic field effect transistor device are also shown in Table 1.

It was demonstrated that cross-linking time, solvent resistance (cracking resistance), and breakdown voltage were inferior to those in Examples 1 to 8.

Comparative Example 4

A resin 17 was obtained in the same manner as in Comparative Example 1 except that cinnamic acid chloride was changed to coumarin-6-carboxylate chloride. Analysis results of $^1$H-NMR (400 MHz, CDCl$_3$) and a structural formula of the polymer are shown below.

The results of analysis by $^1$H-NMR demonstrated that the obtained resin 17 (the following formula) included 94% by mole and 6% by mole of the structural units represented by the formulae (1) and (2), respectively.

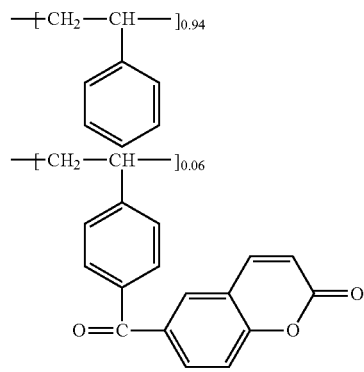

$^1$H-NMR (400 MHz, CDCl$_3$): δ7.82 (brs, —CH═CH—C(O)—), 7.70 to 6.60 (m, aromatic, —CH═CH-Ph), 2.15 (brs, —CH$_2$—CH—), 1.90 to 1.48 (bm, —CH$_2$—)

An insulating film was formed using the obtained resin 3 in the same manner as in Example 1, and then, the organic field effect transistor device was prepared. Evaluation results etc. of the prepared organic field effect transistor device are also shown in Table 1.

It was demonstrated that cross-linking time, solvent resistance (cracking resistance), and breakdown voltage were inferior to those in Examples 1 to 8.

Comparative Example 5

A resin 18 was obtained in the same manner as in Comparative Example 1 except that cinnamic acid chloride was changed to coumarin-6-carboxylate chloride.

The results of analysis by $^1$H-NMR demonstrated that the obtained resin 18 (the following formula) included 88% by mole and 12% by mole of the structural units represented by the formulae (1) and (2), respectively.

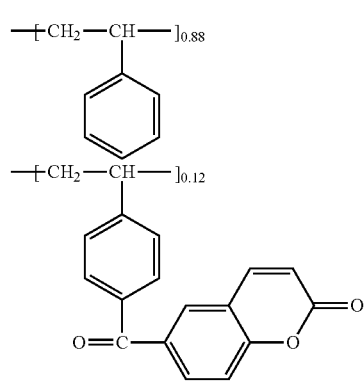

$^1$H-NMR (400 MHz, CDCl$_3$): δ7.82 (brs, —CH═CH—C(O)—), 7.70 to 6.60 (m, aromatic, —CH═CH-Ph), 2.15 (brs, —CH$_2$—CH—), 1.90 to 1.48 (bm, —CH$_2$—)

An insulating film was formed using the obtained resin in the same manner as in Example 1, and then, the organic field effect transistor device was prepared. Evaluation results etc. of the prepared organic field effect transistor device are also shown in Table 1.

It was demonstrated that cross-linking time, solvent resistance (cracking resistance), and breakdown voltage were inferior to those in Examples 1 to 8.

Comparative Example 6

A resin 19 was obtained in the same manner as in Comparative Example 1 except that cinnamic acid chloride was changed to pyridinylethenyl benzoic acid chloride.

The results of analysis by $^1$H-NMR demonstrated that the obtained resin 19 (the following formula) included 94% by mole and 6% by mole of the structural units represented by the formulae (1) and (2), respectively.

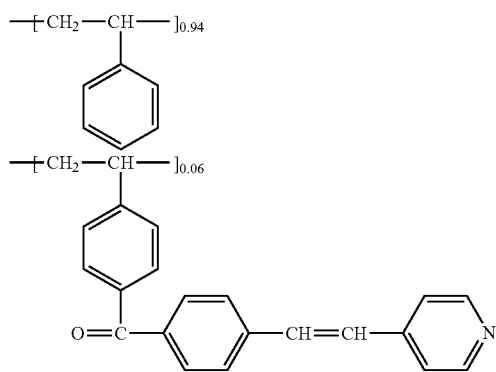

$^1$H-NMR (400 MHz, CDCl$_3$): δ7.80 (brs, Py—CH=CH—), 7.76 to 6.60 (m, aromatic, —CH=CH-Ph), 2.15 (brs, —CH$_2$—CH—), 1.90 to 1.48 (bm, —CH$_2$—)

An insulating film was formed using the obtained resin in the same manner as in Example 1, and then the organic field effect transistor device was prepared. Evaluation results etc. of the prepared organic field effect transistor device are also shown in Table 1.

It was demonstrated that cross-linking time, solvent resistance (cracking resistance), and breakdown voltage were inferior to those in Examples 1 to 8.

Comparative Example 7

A resin 20 was obtained in the same manner as in Comparative Example 1 except that cinnamic acid chloride was changed to pyridinylethenyl benzoic acid chloride.

The results of analysis by $^1$H-NMR demonstrated that the obtained resin 20 (the following formula) included 86% by mole and 14% by mole of the structural units represented by the formulae (1) and (2), respectively.

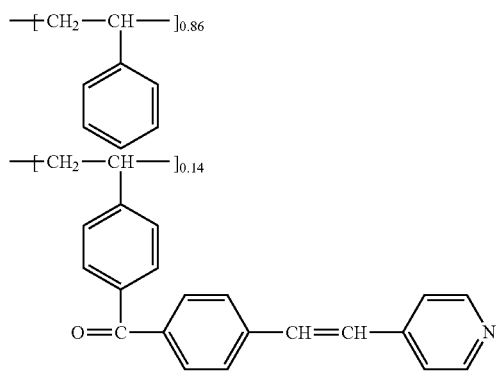

$^1$H-NMR (400 MHz, CDCl$_3$): δ7.80 (brs, Py—CH=CH—), 7.76 to 6.60 (m, aromatic, —CH=CH-Ph), 2.15 (brs, —CH$_2$—CH—), 1.90 to 1.48 (bm, —CH$_2$—)

An insulating film was formed using the obtained resin in the same manner as in Example 1, and then the organic field effect transistor device was prepared. Evaluation results etc. of the prepared organic field effect transistor device are also shown in Table 1.

It was demonstrated that cross-linking time, solvent resistance (cracking resistance), and breakdown voltage were inferior to those in Examples 1 to 8.

Comparative Example 8

A resin 21 was obtained in the same manner as in Comparative Example 1 except that cinnamic acid chloride was changed to phenylethenyl benzoic acid chloride.

The results of analysis by $^1$H-NMR demonstrated that the obtained resin 21 (the following formula) included 95% by mole and 5% by mole of the structural units represented by the formulae (1) and (2), respectively.

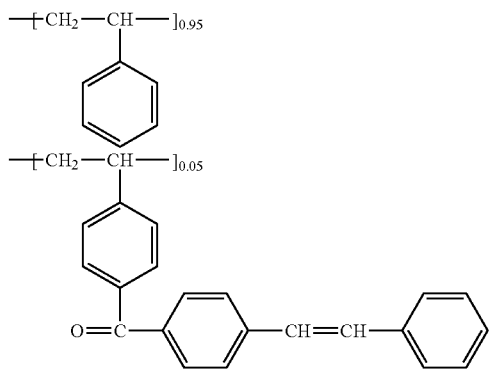

$^1$H-NMR (400 MHz, CDCl$_3$): δ7.67 (brs, —CH=CH—), 7.10 to 6.32 (m, aromatic, —CH=CH-Ph), 2.15 (brs, —CH$_2$—CH—), 1.90 to 1.48 (bm, —CH$_2$—)

An insulating film was formed using the obtained resin in the same manner as in Example 1, the organic field effect transistor device was prepared. Evaluation results etc. of the prepared organic field effect transistor device are also shown in Table 1.

It was demonstrated that cross-linking time, solvent resistance (cracking resistance), and breakdown voltage were inferior to those in Examples 1 to 8.

Comparative Example 9

A resin 22 was obtained in the same manner as in Comparative Example 1 except that cinnamic acid chloride was changed to phenylethenyl benzoic acid chloride.

The results of analysis by $^1$H-NMR demonstrated that the obtained resin 22 (the following formula) included 85% by mole and 15% by mole of the structural units represented by the formulae (1) and (2), respectively.

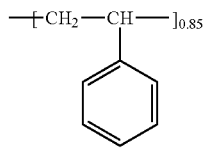

-continued

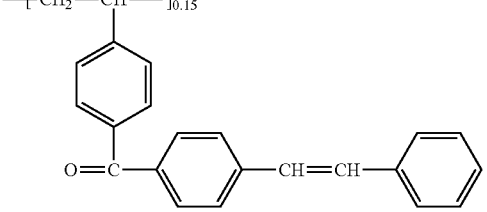

$^1$H-NMR (400 MHz, CDCl$_3$): δ7.67 (brs, —CH═CH—), 7.10 to 6.32 (m, aromatic, —CH═CH-Ph), 2.15 (brs, —CH$_2$—CH—), 1.90 to 1.48 (bm, —CH$_2$—)

An insulating film was formed using the obtained resin in the same manner as in Example 1, the organic field effect transistor device was prepared. Evaluation results etc. of the prepared organic field effect transistor device are also shown in Table 1.

It was demonstrated that cross-linking time, solvent resistance (cracking resistance), and breakdown voltage were inferior to those in Examples 1 to 8.

Although the present invention has been described in detail and with reference to specific embodiments, it is clear to a person skilled in the art that various changes and modifications can be made without departing from the nature and scope of the present invention.

The entire content of the specification, claims, drawings, and abstract of Japanese Patent Application No. 2017-051670 filed on Mar. 16, 2017, No. 2017-199489 filed on Oct. 13, 2017, No. 2018-011579 filed on Jan. 26, 2018, No. 2018-011580 filed on Jan. 26, 2018 is incorporated herein by reference as the disclosure of the specification of the present invention.

The invention claimed is:

1. A resin, consisting of:
a plurality of repeating units represented by the following formula (1);
a plurality of repeating units represented by the following formula (2),
wherein the resin comprises from 20% to 91% by mole of the repeating units represented by the formula (2) with respect to a total amount of the repeating units represented by the formulae (1) and (2):

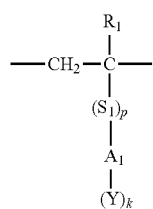

(1)

wherein in the formula (1), R$_1$ represents hydrogen or a C1-C6 alkyl group; S$_1$ represents —O— or —C(O)—; p represents 0; A$_1$ represents a C6-C19 aryl group; Y represents halogen, a cyano group, a carboxyalkyl group, an alkyl ether group, an aryl ether group, a C1-C18 alkyl group, a fluoroalkyl group, or a cycloalkyl group; and k represents 0, wherein s represents the number of carbon atoms constituting the A$_1$,

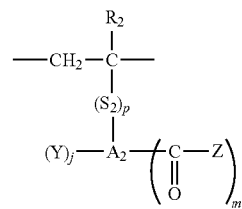

(2)

wherein in the formula (2), R$_2$ represents hydrogen or a C1-C6 alkyl group; S$_2$ represents —O— or —C(O)—; q represents 0; A$_2$ represents a C6-C19 aryl group; Y represents a substituent as defined in formula (1); j represents 0 and m represents 1,
wherein r represents the number of carbon atoms constituting the A$_2$; and Z represents at least one organic group selected from the formulae (A) to (D):

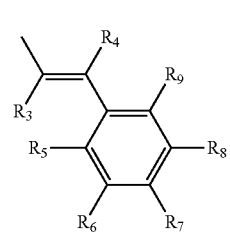

(A)

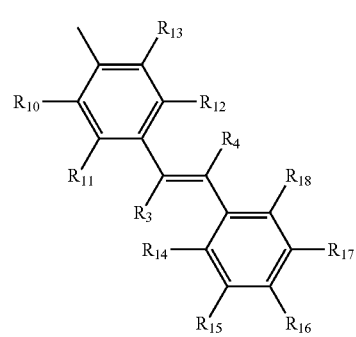

(B)

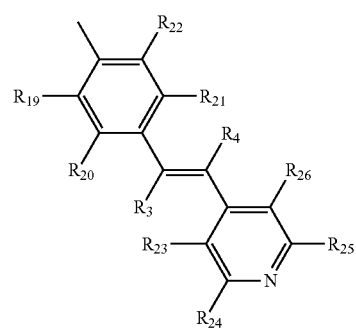

(C)

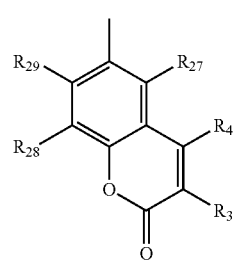

(D)

wherein in the formulae (A) to (D), $R_3$ and $R_4$ each independently represents hydrogen; and $R_5$ to $R_{29}$ independently represent hydrogen; and further optionally,
- a plurality of repeating units represented by the following formula (18);
- a plurality of repeating units represented by the following formula (19); or
- a combination thereof,

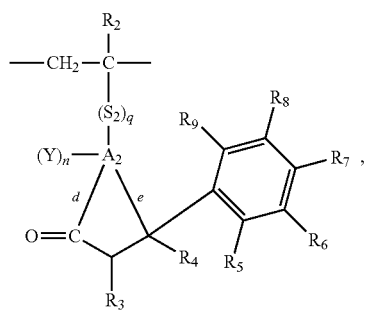
(18)

wherein $R_2$, $S_2$, $A_2$, and Y each represent a substituent defined in the formula (2),
q represents an integer defined in the formula (2),
n represents an integer from 0 to (t-4),
t represents the total number of the carbon atoms constituting $A_2$,
d and e represent single bonds that are located in the ortho positions to each other (bonded to adjacent carbons) on the aromatic group $A_2$, and
$R_3$ to $R_9$ are the same as those defined in the formula (A), and
Z is the formula (A);

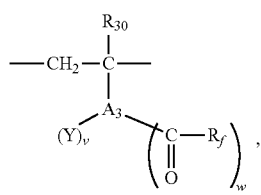
(19)

wherein $A_3$ represents a C6-C19 aryl group,
Y represents substituent defined in the formula (1),
$R_{30}$ represents hydrogen or a C1-C6 alkyl group,
$R_f$ represents a C1-C18 fluoroalkyl group,
v represents an integer from 0 to (u-2),
w represents an integer from 1 to (u-v-1), and
u represents the number of carbon atoms constituting $A_3$.

2. An insulating film, comprising:
a crosslinked product of the resin according to claim 1.

3. An organic field effect transistor device, comprising:
a substrate;
an organic semiconductor layer;
a gate electrode; and
the gate insulating layer comprising the insulating film of claim 2,
wherein, on the substrate, the organic semiconductor layer and the gate electrode are stacked to each other via the gate insulating layer, and
a source electrode and a drain electrode are attached on the organic semiconductor layer.

4. A planarization film comprising the resin according to claim 1 and/or a crosslinked product of the resin according to claim 1.

5. A lyophilic/liquid-repellent patterned film comprising the resin according to claim 1 and/or a crosslinked product of the resin according to claim 1.

6. A film, comprising:
the resin of claim 1;
wherein the film is a planarization film.

7. A film, comprising:
the resin of claim 1; and
a crosslinked product of the resin of claim 1,
wherein the film is a lyophilic/liquid-repellent patterned film.

8. The resin of claim 1, wherein the organic group of the formula (A) is one of followings:

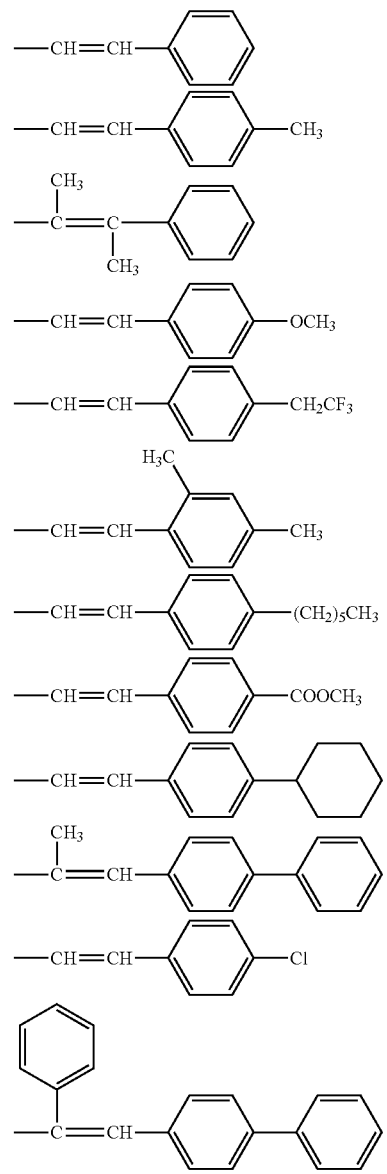

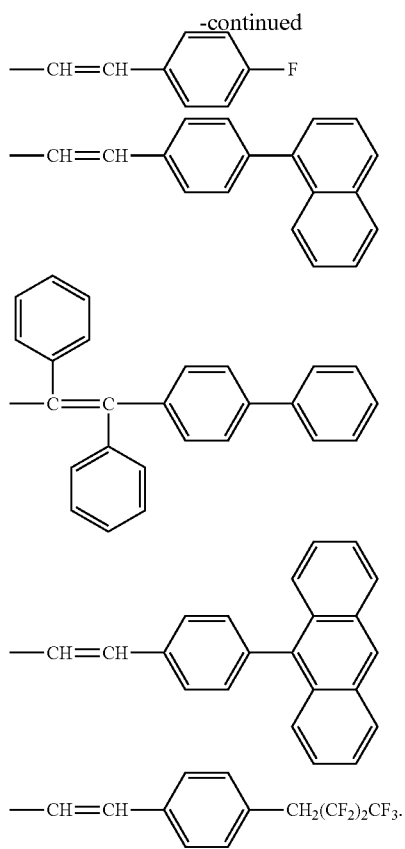

9. The resin of claim 1, wherein $R_{30}$ in the formula (19) is the C1-C6 alkyl group which is one of a methyl group, an ethyl group, a n-propyl group, an isopropyl group, and a n-butyl group.

10. A film, comprising:
    the resin of claim 9,
    wherein the film is a lyophilic/liquid-repellent patterned film.

11. A film, comprising:
    a crosslinked product of the resin of claim 9,
    wherein the film is a lyophilic/liquid-repellent patterned film.

12. A film, comprising:
    the resin of claim 9; and
    a crosslinked product of the resin of claim 9,
    wherein the film is a lyophilic/liquid-repellent patterned film.

13. A film, comprising:
    the resin of claim 1,
    wherein the film is a lyophilic/liquid-repellent patterned film.

14. A film, comprising:
    a crosslinked product of the resin of claim 1,
    wherein the film is a lyophilic/liquid-repellent patterned film.

15. A film, comprising:
    a crosslinked product of the resin of claim 1,
    wherein the film is a planarization film.

* * * * *